United States Patent

Hotta et al.

[11] Patent Number: 5,912,320
[45] Date of Patent: Jun. 15, 1999

[54] POLYPHENYLENE SULFIDE RESIN COMPOSITION AND RESIN-ENCAPSULATED SEMICONDUCTOR DEVICE

[75] Inventors: Yasuyuki Hotta, Funabashi; Shinetsu Fujieda, Kawasaki; Tetsuo Okuyama, Yokohama, all of Japan

[73] Assignee: Kabushiki Kaisha Toshiba, Kawasaki, Japan

[21] Appl. No.: 08/939,661

[22] Filed: Sep. 29, 1997

[30] Foreign Application Priority Data

Sep. 30, 1996 [JP] Japan ................................. 8-259531
Dec. 13, 1996 [JP] Japan ................................. 8-333723
Aug. 29, 1997 [JP] Japan ................................. 9-249459

[51] Int. Cl.$^6$ .................................................. C08G 75/00
[52] U.S. Cl. ........................... 528/373; 528/395; 524/81; 524/132; 524/175; 524/266; 525/328.5; 428/425.9; 428/429; 428/472.2; 428/698
[58] Field of Search ..................................... 528/373, 395; 524/81, 132, 266, 175; 525/328.5; 428/425.9, 429, 472.2, 698

[56] References Cited

U.S. PATENT DOCUMENTS 5,032,674  7/1991  Köhler et al. .
5,064,895  11/1991  Köhler et al. .
5,474,853  12/1995  Watanabe et al. ............... 428/458

*Primary Examiner*—Duc Truong
*Attorney, Agent, or Firm*—Oblon, Spivak, McClelland, Maier & Neustadt, P.C.

[57] ABSTRACT

A polyphenylene sulfide resin composition, which comprises, in addition to a polyphenylene sulfide resin and an inorganic filler, at least one whisker selected from the group consisting of titania whisker and aluminum borate whisker.

18 Claims, 2 Drawing Sheets

POLYPHENYLENE SULFIDE RESIN COMPOSITION AND RESIN-ENCAPSULATED SEMICONDUCTOR DEVICE

BACKGROUND OF THE INVENTION

This invention relates to a polyphenylene sulfide resin composition, and to a resin-encapsulated semiconductor device manufactured by making use of the polyphenylene sulfide resin composition.

Almost all kinds of resin-encapsulated semiconductor devices are now sealed by making use of a transfer molding method. According to the transfer molding method, an uncured resin tablet such as epoxy resin molding material consisting mainly of epoxy resin containing phenol novolak resin as a curing agent and a filler is heated to melt at first, and then the resultant melt is poured into a mold by making use of a transfer molding machine, thereby allowing the melt to be cured under a high temperature and high pressure condition, thus obtaining a resin-encapsulated semiconductor device where a semiconductor chip mounted on a lead frame for instance is sealed with a resin composition. The resin-encapsulated semiconductor device manufactured in this manner is excellent in reliability because the semiconductor chip is completely sealed and also excellent in the outer appearance thereof as a package because it is densely molded by making use of a mold. In addition to this transfer molding method, there are known an injection molding method employing a thermoplastic resin and a potting method employing a liquid sealing resin, which are now actually employed in the manufacture of a resin-encapsulated semiconductor device.

Meanwhile, in a recent trend to enlarge the dimension of a semiconductor chip in compliance with an increasing integration density of semiconductor device, the requisites demanded of a resin to be employed for encapsulating a semiconductor device has become increasingly severe. There are also demands for a development of material which is pollution-free or unharmful to environments and suited for improving the productivity of a resin-encapsulated semiconductor device, and for a development of a molding method which is capable of minimizing the production of useless portions such as cull and runner. Furthermore, there are also demands for a development of a recyclable sealing material, or for a development of a sealing material which is excellent in storage stability.

Generally, an epoxy resin-based sealing material contains as a flame retardant a halogen compound or antimony trioxide. Furthermore, the ordinary epoxy resin-based sealing material also contains a large amount of a curing agent with a view of improving the productivity thereof. However, due to the inclusion of these additives, the ordinary epoxy resin is poor in storage stability. Since the addition of a flame retardant such as halogen compound is not desirable because of the reason as mentioned above, it is now studied to develop an epoxy resin-based sealing material where these materials would be incorporated in a lesser amount or would not be incorporated at all, or to develop a latent catalyst which is excellent in storage stability.

In order to ensure the flame retardency of epoxy resin-based sealing material without incorporating a flame retardant, the content of a filler may be required to be increased. Under the circumstances, it has been studied to find out a filler exhibiting an excellent fluidity or a resin of low viscosity. However, most of these attempts have failed to put them into practical use, since the employment of such a filler or resin would lead to a deterioration of moldability. Accordingly, it has become difficult to employ an epoxy resin-based sealing material while meeting the aforementioned severe demands of today.

On the other hand, the employment of thermoplastic resin such as PPS (polyphenylene sulfide) resin and liquid crystal polymer is now studied. Although these thermoplastic resins are excellent in storage stability and flame retardency, the viscosity thereof is relatively high, so that various problems would be raised when these thermoplastic resins are employed for encapsulating a semiconductor element. Specifically, bonding wires may be excessively deformed so that a phenomenon such as a dislocation of bed may be caused. Moreover, since these thermoplastic resins are poor in adhesivity to a metal member to be encapsulated, such as a 42 alloy frame, a Cu frame or a semiconductor chip, it has been difficult to manufacture a semiconductor device having a sufficient moisture resistance. In particular, when the encapsulation of a semiconductor device is performed by making use of a PPS resin, the resultant encapsulated semiconductor device may become poor in ductility thus making it fragile, so that it is impossible to obtain a sufficient strength and toughness which are desired of a resin composition for encapsulating a semiconductor element. In an attempt to overcome this problem, the employment of a PPS resin which is low in molecular weight and in viscosity, and contains a large amount of a filler is now studied. However, since this sealing resin is low in molecular weight, it would be impossible to obtain a sufficient mechanical strength after the curing thereof, and, due to this fragility, the resultant package may be destroyed at the occasion of ejecting it from a mold. It is also studied to employ various additives for the purpose of improving the adhesivity of the PPS resin. However, there is a problem that the employment of these additives may damage the inherent characteristics of the PPS resin such as flame retardency.

Moreover, the synthesis of PPS resin may accompany a production of ionic impurities such as Na and Cl as a side reaction product. If these impurities are left remained in a resin composition, they would badly affect the reliability of the resultant semiconductor device. Therefore, various methods have been tried to wash out or remove these ionic impurities. However, the resin composition which has been subjected to a treatment to remove these ionic impurities by the conventional method becomes poor in adhesivity to a metal such as a lead frame, so that water may be penetrated into an interface between the resin and a lead frame thereby to deteriorate the reliability of semiconductor device. A coupling treatment of a lead frame or a method of coating an epoxy type adhesive on a lead frame may be effective to solve this problem. However, even if these treatments are employed, it is still difficult to obtain a satisfactory product which is capable of withstanding a high temperature and high humidity condition. Furthermore, the employment of these treatments are not preferable in view of simplifying the process and enhancing the productivity.

As explained above, the employment of an epoxy resin-base sealing material is accompanied with various problems such as poor storage stability. On the other hand, it has been difficult in the employment of a PPS resin to realize an excellent moldability and a sufficient strength though the PPS resin is excellent in storage stability and flame retargency.

BRIEF SUMMARY OF THE INVENTION

Therefore, an object of the present invention is to provide a polyphenylene sulfide resin composition which is excellent in moldability and in adhesivity to other members, exhibits a high strength after the curing thereof, and is excellent in storage stability and in flame retargency.

Another object of the present invention is to provide a resin-encapsulated semiconductor device which is excellent in reliability with respect to a long term moisture resistance.

Namely, this invention provides a polyphenylene sulfide resin composition, which comprises, in addition to a polyphenylene sulfide resin and an inorganic filler, at least one whisker selected from the group consisting of titania whisker and aluminum borate whisker.

This invention also provides a polyphenylene sulfide resin composition, which comprises (a) a polyphenylene sulfide resin; (b) an inorganic filler; (c) at least one kind of compounds selected from the group consisting of a polymerized indene, a phenol aralkyl resin and a novolak type phenol resin.

Further, this invention provides a polyphenylene sulfide resin composition, which comprises a polyphenylene sulfide resin and an inorganic filler; wherein the polyphenylene sulfide resin includes a component exhibiting a non-Newtonian index (n) of 1.1 or more; and the inorganic filler includes 5 to 40 wt %, based on a total amount thereof, of fine particles having an average particle diameter of 1 $\mu$m or less.

Furthermore, this invention provides a polyphenylene sulfide resin composition, which comprises 20 to 70 wt % of a mixture consisting of a first polyphenylene sulfide resin and a second polyphenylene sulfide resin, and 30 to 80 wt % of an inorganic filler; wherein the first polyphenylene sulfide resin has a melting viscosity ranging from 1 to 15 Pa·s, and the second polyphenylene sulfide resin has a melting viscosity ranging from 15 to 50 Pa·s and is of substantially non-crosslinking structure; and a content of the first polyphenylene sulfide resin being 10 to 80 wt % based on the mixture, and a content of the second polyphenylene sulfide resin being 90 to 20 wt % based on the mixture.

Additionally, this invention provides a resin-encapsulating semiconductor device comprising a semiconductor element, and a resin layer sealing the semiconductor element, wherein the resin layer is formed of a cured material of any one of the aforementioned polyphenylene sulfide resin compositions.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
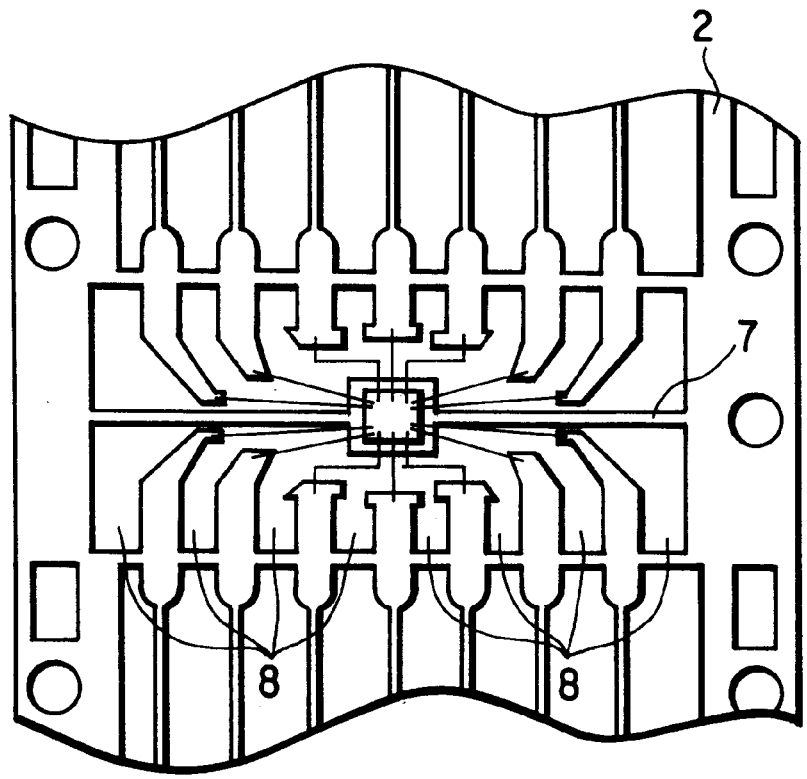
FIG. 1 is a plan view schematically showing one example of a semiconductor element mounted on a lead frame, which is to be sealed with a resin composition of this invention.

This invention will be further explained in details as follows.

(EXAMPLE I)

This example explains a polyphenylene sulfide (PPS) resin composition which comprises, in addition to a PPS resin and an inorganic filler, a specific kind of whisker so as to improve the adhesivity thereof to a lead frame or a semiconductor element.

There is any particular limitation with respect to the PPS resin to be employed in this example as long as it is a compound that can be obtained through a condensation reaction between p-dichlorobenzene and sodium sulfide. For example, the PPS resin may be a compound represented by the following general formula (1) which can be manufactured by a known manufacturing method.

(1)

wherein n represents an integer of 10 or more.

The chain structure represented by the above general formula (1) may contain any of the following groups.

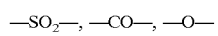

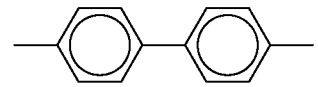

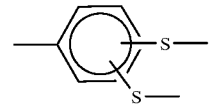

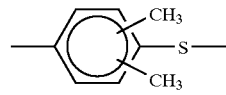

Specific examples of this PPS resin are a linear polymer type resin such as LN-01G, LV-01G, LN-02, LN-03, LN-04 and LC-07; a semi-linear type resin such as T-1, T-3AG, T-4AG, T-7, T-3 and T-4; and a crosslinking type resin or a crosslinking precursor such as H-1, K-2, K-3 and K-4 (all being trade names; products from Tonen Kagaku Inc.). Additionally, M-3910 and L-3340 (trade names; products from Toray Industries Inc.), W-202 (trade name; a product from Kureha Chemical Industry Co. Ltd.) and EX-3192 (trade name; a product from Dainippon Ink & Chemicals Inc.) may be employed. Among them, a resin of low viscosity is preferable in view of preventing the bonding wire of semiconductor element from being deformed at the occasion of injection molding. Specific examples of such a resin are LN-01G, LV-01G, LN-02 and H-1. The molecular weight of PPS according to this invention should preferably be in a range of from 5,000 to 50,000 in view of fluidity, moldability and mechanical property.

If the PPS of this invention is to be employed for encapsulating a semiconductor element, the content of ionic impurities such as Na and Cl should be confined to 500 ppm or less. These ionic impurities may be removed by making use of the following methods so as to obtain a resin of high purity. Namely, a method of washing a reaction product with deionized water and filtering the reaction product; a method of washing a reaction product with hot deionized water and filtering the reaction product; and a method of forcibly removing the impurities by making use of an autoclave.

The content of the aforementioned PPS in the resin composition of this example should preferably be in the range of about 20 to 70 wt %. If the content of the PPS is less than 20 wt %, it may be not only impossible to sufficiently take advantage of the inherent property of PPS such as fluidity, etc. but also difficult to avoid a breaking of the bonding wire. On the hand, if the content of the PPS exceeds over 70 wt %, the molding shrinkage and thermal expansion coefficient of the resin composition become excessive, thereby deteriorating the reliability of the device.

As for the kind of inorganic filler to be employed in this example, fused silica, crystalline silica, glass, talc, alumina, calcium silicate, calcium carbonate, barium sulfate, magnesia, silicon nitride, boron nitride, aluminum nitride, magnesium oxide, beryllium oxide and mica may be exemplified. Among these inorganic fillers, fused silica and crystalline silica are especially preferable because these inorganic fillers are low in hygroscopicity and would give a resin composition of low melt viscosity. As for the shape of the inorganic filler, it may be fragmental, spherical, semi-spherical, fibrous or flaky, but spherical or semi-spherical inorganic filler is most preferable. If spherical silica is to be employed, the average particle diameter thereof should preferably be 30 $\mu$m or less in view of facilitating the filling of the resin composition into a thin package and of alleviating a damage to the bonding wire.

The aforementioned spherical silica may be employed singly. However, when two different kinds of spherical silica which differ in particle size from each other, i.e. a small spherical silica having an average particle diameter of 0.1 to 5 $\mu$m and a large spherical silica having an average particle diameter of 10 to 30 $\mu$m, are employed in combination, the fluidity of the resin composition would be improved. In this case, the content of the large spherical silica should preferably be 30 to 79.5 wt % based on the total weight of the resin composition, and the content of the small spherical silica should preferably be 0.5 to 30 wt % based on the total weight of the spherical silica.

A fibrous inorganic filler may be also employed for improving a reinforcing effect of filler. Examples of the fibrous inorganic filler are whiskers such as titania, aluminum borate, silicon carbide, silicon nitride, potassium titanate, basic magnesium, zinc oxide, graphite, magnesia, calcium sulfate, magnesium borate, titanium diboride, $\alpha$-alumina, chrysotile and wallastnite; amorphous fibers such as E-glass fiber, silica alumina fiber and silica glass fiber; and crystalline fibers such as tirano fiber, silicon carbide fiber, zirconia fiber, $\gamma$-alumina fiber, $\alpha$-alumina fiber, PAN-based carbide fiber and pitch-based carbon fiber. The fibrous inorganic filler should preferably be 5 $\mu$m or less in average thickness and 50 $\mu$m or less in maximum length in view of facilitating the filling of the resin composition into a thin portion and of alleviating a damage to the bonding wire.

The mixing ratio of the aforementioned inorganic filler should preferably be 80 wt % or less based on the entire resin composition. If the mixing ratio of the inorganic filler exceeds over 80 wt %, the fluidity of the resultant resin composition may become insufficient so that a drifting of bonding wire, a dislocation of bed and an insufficient filling may be caused to occur. However, if the mixing ratio of the inorganic filler is too little, the thermal expansion coefficient of the cured product may become too large, so that the thermal shock resistance of the device may become insufficient. Therefore, the mixing ratio of the inorganic filler should preferably be 30 wt % or more based on the entire resin composition.

The titania whisker to be employed in this example can be manufactured by a process wherein potassium titanate whisker is acid-treated and then subjected to a de-potassium treatment thereby to obtain titania, which is then heat-treated to manufacture a monoclinic titania whisker. The monoclinic titania whisker should preferably be 5 $\mu$m or less in average length, 50 $\mu$m or less in maximum length and 5 $\mu$m or less in thickness. If a whisker of large dimension which exceeds over aforementioned limitations is employed, not only the workability of the resin composition will be lowered, but also the breaking of bonding wire may be caused to occur. More preferably, the titania whisker should be 1 $\mu$m or less in average length, 30 $\mu$m or less in maximum length and 2 $\mu$m or less in thickness.

As for the aluminum borate whisker, three kinds of compounds may be exemplified, i.e. $9Al_2O_3 \cdot 2B_2O_3$, $2Al_2O_3 \cdot 2B_2O_3$ and $Al_2O_3 \cdot 2B_2O_3$. These compounds can be synthesized by the following methods. Namely, $Al_2O_3$ and $H_3BO_3$ (or $B_2O_3$) are mixed together at first, and the resultant mixture is then heated at a high temperature (2,100° C. or more) to melt and mix it. After being cooled, the molten mixture is subjected to a fiber growth process by means of a melting method thereby to synthesize the aluminum borate whisker. This aluminum borate whisker may also be synthesized by making use of a vapor phase method wherein water vapor is passed through a vapor phase mixture of $AlF_3$ and $B_2O_3$ which is heated up to 1,000 to 1,400° C. thereby to allow the whisker to grow. It is also possible to synthesize the aluminum borate whisker by making use of an internal flux method or an external flux method. The internal flux method is performed as follows. Namely, in the process of growing a monocrystal, $Al_2O_3$ or a compound capable of generating $Al_2O_3$ is allowed to melt and then the resultant melt is mixed with a flux component such as $B_2O_3$ or $Na_2B_4O_7$, which functions to promote a crystal growth, thereby allowing the whisker to grow at a temperature of 1,200° C. to 1,400° C. On the other hand, the external flux method is performed as follows. Namely, first of all, raw materials which are capable of generating $Al_2O_3$ or $B_2O_3$ are heated at a temperature of 1,000° C. or more and then admixed with a chloride, sulfate or carbonate of an alkaline metal as a flux component taking no part in the reaction. Then, the resultant mixture is heated to a temperature of 1,000° C. to 1,200° C. thereby to allow $9Al_2O_3 \cdot 2B_2O_3$ to grow, thus forming the aimed whisker.

Any of these whiskers, which are produced by making use of either one of these methods, may be employed in this example. This aluminum borate whisker should preferably be 5 μm or less in average length, 50 μm or less in maximum length and 5 μm or less in thickness. If a whisker of large dimension which exceeds over aforementioned limitations is employed, not only the workability of the resin composition will be lowered, but also the breaking of bonding wire may be caused to occur. More preferably, the aluminum borate whisker should be 1 μm or less in average length, 30 μm or less in maximum length and 2 μm or less in thickness.

If the aforementioned monoclinic titania whisker and aluminum borate whisker are surface-treated by making use of an ordinary coupling agent, such as an organosilicic coupling agent, a Ti-based coupling agent, an Al-based coupling agent or a Zr-based coupling agent, the fluidity of the resultant resin composition and the strength after curing of the resin composition would be improved.

The mixing ratio of the aforementioned titania whisker and/or aluminum borate whisker in a resin composition according to this example should preferably be 50 wt % or less based on the aforementioned inorganic filler. If the mixing ratio of these whiskers exceeds over 50 wt %, the viscosity of the resultant resin composition would be excessively increased so that not only the workability of the resin composition will be lowered, but also the breaking of bonding wire may be caused to occur. However, if the mixing ratio of the titania whisker is too little, it would be impossible to expect a sufficient effect of these whiskers. Therefore, the mixing ratio of these whiskers should preferably be 5 wt % or more based on the aforementioned inorganic filler.

It is also possible in this example to add a heat resistant thermoplastic resin or a heat resistant rubber to the PPS resin composition for the purpose of reducing the elastic modulus. Examples of the heat resistant thermoplastic resin are polyamide resin, aromatic polyester resin, a phenoxy resin, ABS resin, silicone resin, silicone rubber and fluoro-rubber. It is also possible to add various kinds of plastic powder or various kinds of engineering plastic powder to the PPS resin composition for the purpose of providing the resin composition with a stress-relieving property.

These plastic powder functioning as a stress-relieving component should preferably be 100 μm or less in maximum particle size, more preferably 50 μm or less in maximum particle size. If these heat resistant thermoplastic resin and heat resistant rubber added to the PPS resin composition are too large in particle size, a semiconductor element or boding wire may be damaged at the occasion of encapsulating the semiconductor element with the PPS resin composition, thus deteriorating the reliability of the resultant resin-encapsulated semiconductor device.

Various kinds of additives other than the aforementioned additives may be also added to the resin composition of this example depending on the end-use of the product. For example, a parting agent such as a heat resistant wax for improving a mold-releasing property of resin composition, an adhesion promoting agent for improving the adhesion between a resin layer and a semiconductor element or lead frame, a coupling agent, an anti-oxidant, a heat stabilizer, an corrosion inhibitor, an ultraviolet inhibitor, a nucleating agent, a fluidizing agent or a burr inhibitor may be added to the resin composition.

The mixing ratio of these additives may be suitably determined within a range which would not give a bad influence to the PPS resin composition of this invention.

The PPS resin composition of this invention may be manufactured as follows. Namely, an inorganic filler is treated with a coupling agent while mixing them in a Henschel mixer, and then the resultant inorganic filler is mixed with a PPS resin component to obtain a molten mixture, which is extruded by means of an extruder and subsequently pelletized by making use of a pelletizer.

The encapsulation of a semiconductor element by making use of a PPS resin composition of this invention can be performed by any suitable molding method, such as an injection molding, a compression molding, a transfer molding or a casting. Alternatively, the PPS resin composition may be made into a sheet, which is subsequently cut into a piece of suitable size to use it to sandwich a semiconductor element, the resultant laminated body being press-bonded from the top and bottom surfaces thereof. This latter molding method can be applied to a surface packaging such as a flip chip bonding.

The PPS resin composition according to this invention can be employed not only for encapsulating a semiconductor element but also for manufacturing a precision electronic component, a precision electric component, an automobile component, a sliding member, a heat resistant laminate board, a mounting agent, a casting material, a heat resistant adhesive or a heat resistant paint.

Since the PPS resin composition according to this example contains at least one kind of whisker selected from the group consisting of titania whisker and aluminum borate whisker, the resin composition is relatively low viscosity, and excellent in mechanical characteristic as well as in adhesivity to other materials as compared with the conventional PPS resin composition. Moreover, the inherent properties of the PPS resin such as storage stability and flame-retarding property are not damaged at all by the inclusion of these whiskers.

When the encapsulation of a semiconductor element is performed by making use of the resin composition according to this example, it is possible to avoid any deformation of the bonding wire of semiconductor element, to obtain an excellent adhesion with a lead frame or the semiconductor element, and to suppress the moisture adsorption even under a high temperature and high humidity condition. Moreover, since the resin composition according to this example is low in viscosity, the molding time of the resin composition can be shortened. It is also possible according to the resin composition of this example to realize an excellent flame retardation without incorporating toxic halogen compound or antimony trioxide. Accordingly, when the encapsulation of a semiconductor element is performed by making use of the resin composition according to this example, it is possible to provide a resin-encapsulated semiconductor device exhibiting an excellent reliability for a long period of time.

This invention will be further explained with reference to the following specific examples and comparative examples, which are not intended to limit this invention.

(EXAMPLE I-1)

Fillers and resins were mixed together in accordance with the formulations shown in the following Tables 1 and 2. Specifically, a filler was put into a Henschel mixer to stir it at a rotation speed of 4,000 rpm and, at the same time, subjected to a coupling treatment with stirring. Then, a PPS resin was added to the filler and the resultant mixtures were further stirred to obtain a homogeneous powder of PPS resin composition as indicated in Tables 1 and 2 as Examples 1 to 8, as Comparative Examples 1 to 3 and as Reference Example.

Then, each powdery resin composition was kneaded and extruded by making use of a double-screw extruder heated to a temperature of 280 to 310° C. and provided with a 6-hole die. The resin thus kneaded and discharged from the 6-hole die was cooled with water and then cut in a predetermined size by making use of a pelletizer thereby obtaining a resin pellet.

TABLE 1

|  | 1 | 2 | 3 | 4 | 5 | 6 | 7 | 8 |
|---|---|---|---|---|---|---|---|---|
| PPS-1 | 40 |  |  |  |  | 40 | 40 | 40 |
| PPS-2 |  | 40 |  |  |  |  |  |  |
| PPS-3 |  |  | 40 |  |  |  |  |  |
| PPS-4 |  |  |  | 40 |  |  |  |  |
| PPS-5 |  |  |  |  | 40 |  |  |  |
| PPS-A |  |  |  |  |  |  |  |  |
| Spherical silica A Average particle diameter 22 μm | 48 | 48 | 48 | 48 | 48 | 36.3 | 48 | 48 |
| Spherical silica B Average particle diameter 0.5 μm | 5.4 | 5.4 | 5.4 | 5.4 | 5.4 | 5.3 | 5.4 | 5.4 |
| Titania whisker A | 6.0 | 6.0 | 6.0 | 6.0 | 6.0 | 17.8 |  |  |
| Titania whisker B |  |  |  |  |  |  | 6.0 |  |
| Titania whisker C |  |  |  |  |  |  |  | 6.0 |
| Potassium titanate whisker |  |  |  |  |  |  |  |  |
| Silicon carbide whisker |  |  |  |  |  |  |  |  |
| E glass |  |  |  |  |  |  |  |  |
| Carbon black | 0.3 | 0.3 | 0.3 | 0.3 | 0.3 | 0.3 | 0.3 | 0.3 |
| Epoxy silane coupling agent A-187 | 0.3 | 0.3 | 0.3 | 0.3 | 0.3 | 0.3 | 0.3 | 0.3 |

TABLE 2

|  | Comp. Ex. | | | Ref. Ex. |
|---|---|---|---|---|
|  | 1 | 2 | 3 |  |
| PPS-1 | 40 | 40 | 40 |  |
| PPS-2 |  |  |  |  |
| PPS-3 |  |  |  |  |
| PPS-4 |  |  |  |  |
| PPS-5 |  |  |  |  |
| PPS-A |  |  |  | 40 |
| Spherical silica A Average particle diameter 22 μm | 48 | 48 | 48 | 48 |
| Spherical silica B Average particle diameter 0.5 μm | 5.4 | 5.4 | 5.4 | 5.4 |
| Titania whisker A |  |  |  | 6.0 |
| Titania whisker B |  |  |  |  |
| Titania whisker C |  |  |  |  |
| Potassium titanate whisker | 6.0 |  |  |  |
| Silicon carbide whisker |  | 6.0 |  |  |
| E glass |  |  | 6.0 |  |
| Carbon black | 0.3 | 0.3 | 0.3 | 0.3 |
| Epoxy silane coupling agent | 0.3 | 0.3 | 0.3 | 0.3 |

The values shown in Tables 1 and 2 denote the mixed contents of the components, which are indicated by % by weight.

The code numbers shown in these tables represent respectively a PPS resin illustrated below.

PPS-1: Linear polymer type LN-01 (a product from Tonen Kagaku Inc.)

PPS-2: Crosslinking precursor polymer type H-1 (a product from Tonen Kagaku Inc.)

PPS-3: Semi-linear polymer type LJ-03 (a product from Tonen Kagaku Inc.)

PPS-4: M-3910 (a product from Toray Industries Inc.)

PPS-5: M-3340 (a product from Toray Industries Inc.)

PPS-A: Linear polymer type; a low viscosity type

The concentrations of $Na^+$ ion and $Cl^-$ ion in these PPS resins are summarized in Table 3 below.

TABLE 3

|  | $Na^+$ ion (ppm) | $Cl^-$ ion (ppm) |
|---|---|---|
| PPS-1 | 24 | 30 |
| PPS-2 | 120 | 235 |
| PPS-3 | 87 | 113 |
| PPS-4 | 318 | 164 |
| PPS-5 | 215 | 142 |
| PPS-A | 1560 | 875 |

As seen from Table 3, the PPS resin (PPS-A) mixed in the resin composition of Reference Example indicated an extremely high concentration of ionic impurities.

The titania whiskers (A) to (C) which were mixed in the compositions of Examples 1 to 8 were all 0.1 to 1 μm in thickness of fiber and 10 to 20 μm in length of fiber. Among them, the titania whiskers (B) and (C) were subjected to an epoxy silane-based surface treatment and an amino silane-based surface treatment, respectively.

The dimension of whiskers which were mixed into the resin compositions of Comparative Examples was as follows.

Potassium titanate whisker: 0.4 μm in thickness and 10 to 20 μm in length.

Silicon carbide whisker: 5.0 μm in thickness and 5 to 200 μm in length.

E glass whisker: 10 μm in thickness and 60 μm in length.

Each pellet thus obtained was allowed to dry at a temperature of 150° C. for 20 hours, and then each pellet was charged into a screw preplasticating type vertical injection molding machine provided with a DIP 14-pin die thereby to encapsulate a test semiconductor element (a 2 mm square chip) with a resin as shown in FIG. 1. The molding in this case was performed under the conditions: 310° C. in melting temperature; 500 kg/cm$^2$ in injection pressure with a die temperature of 170° C.; and 20 seconds in compression time. The molding was performed by making use of a die which was designed for forming each test piece and under the same molding conditions. In FIG. 1, a lead frame is indicated by a reference numeral 2, a suspending pin is indicated by 7, and a diver portion is indicated by 8.

Figure 2:
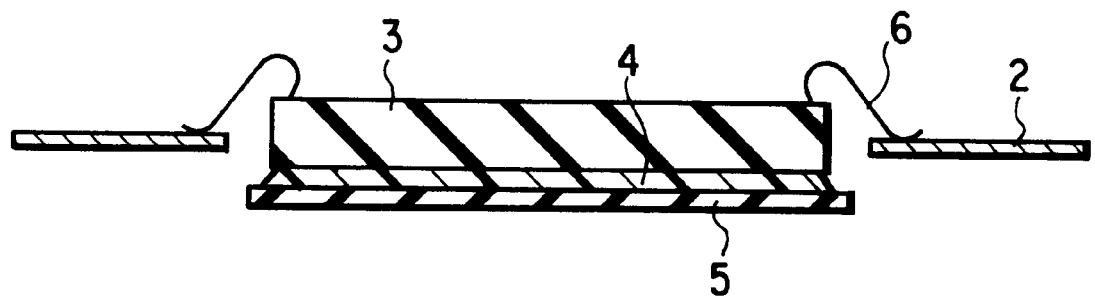
FIG. 2 is a cross-sectional view showing one example of a semiconductor element to be sealed with a resin composition of this invention.
Figure 3:
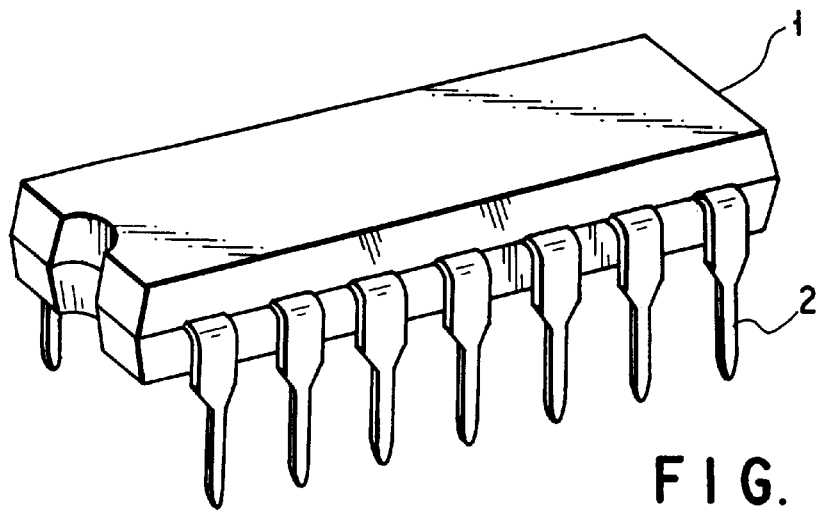
FIG. 3 is a perspective view showing one example of a resin-encapsulated semiconductor device according to this invention.

FIG. 2 illustrates a cross-sectional view, before encapsulation, of the test semiconductor element , while FIG. 3 illustrates a schematical view, after encapsulation, of an encapsulated test semiconductor element. As shown in FIG. 2, a semiconductor chip 3 is mounted via a mounting agent 4 on a die pad 5 and connected to a lead frame 2 via a bonding wire 6. After this semiconductor device constructed as mentioned above was encapsulated by any one of the aforementioned resin compositions, the lead frame 2 was trimmed by making use of a lead cutter and then subjected to a bending work to manufacture a package 1 as shown in FIG. 3.

After the semiconductor device thus obtained was checked to see if there was any defective, the outer appearance of the molded body, the smear of cavity and the packing degree of the package were investigated. In this case, the outer appearance of the molded body was evaluated by the observation of the surface of the package by making use of a microscope to see if there is any sink mark or shrinkage void thereon. The smear of cavity was evaluated by repeating 100 shots of the same molded product by making use of a single mold and by observing the surface of the cavity. The packing degree of the package was evaluated by checking the package to see if there is any unfilled portion by making use of a microscope.

The adhesion between the resin layer and the lead frame in each package was investigated as follows. Namely, a red ink was charged into a pressure cooker, and the package was treated with the pressure cooker under an atmosphere of 2.5 atm. to measure a distance of penetration of the red ink into the package, particularly at the portion of the suspending pin 7. More specifically, this test was performed by the following steps.

(1) Test with a pressure cooker (red ink test);
(2) Washing the package with water;
(3) Wiping of water;
(4) Interlayer fracture at the interface between the lead frame and the resin layer; and
(5) Observation with a microscope.

The general features of the PPS resin compositions of Examples, Comparative Examples and Reference Example were investigated by the following means.

Glass transition Point: TMA (manufactured by Seiko Denshi Inc.)

Thermal expansion coefficient: TMA (manufactured by Seiko Denshi Inc.)

Flexural strength and modulus of elasticity: JIS K-6911

Water absorption (85° C., 85%, 168 hours): Thermohygrostat (manufactured by TABAI Inc.)

The results obtained are summarized together with the evaluation on the moldability in the following Table 4.

The packages obtained by making use of the resin compositions of Examples 1 to 8, Comparative Examples 1 to 3 and Reference Example were examined by means of X-ray photographing thereby to see any drifting of bonding wire to determine any deformation of bonding wire. Then, 20 pieces of sample were subjected to 50 to 400 times of thermal shock cycle, each cycle consisting of changes in temperature of −65° C. to room temperature to 150° C., to check the operating characteristic of the device thereby to investigate the percent defective of the device.

Furthermore, the moisture resistance of the package was also evaluated by making use of a pressure checker. Specifically, each package was left to stand for a prescribed period of time in a 2.5 atm. saturated water vapor heated to a temperature of 127° C., and the percent defective (leak defective or open defective) of the device after every predetermined period time was investigated, thereby evaluating the moisture resistance to the package.

The results of these reliability tests are summarized in Table 5 shown below.

TABLE 4

|  | Example | | | | | | | |
|---|---|---|---|---|---|---|---|---|
|  | 1 | 2 | 3 | 4 | 5 | 6 | 7 | 8 |
| Moldability | | | | | | | | |
| External apparece | ○ | ○ | ○ | ○ | ○ | ○ | ○ | ○ |
| Stain of cavity | ○ | ○ | ○ | ○ | ○ | ○ | ○ | ○ |
| Filling property of package | ○ | ○ | ○ | ○ | ○ | ○ | ○ | ○ |
| Compression molding time | 20 | 20 | 20 | 20 | 20 | 20 | 20 | 20 |
| General characteristics | | | | | | | | |
| Adhesivity to lead frame/Penetration distance (mm) | 0.2 | 0.2 | 0.1 | 0.5 | 0.3 | 0.1 | 0.1 | 0.1 |
| Glass transition point (° C.) | 89 | 85 | 89 | 90 | 90 | 93 | 98 | 96 |
| Thermal expansion coefficient ($\times 10^{-5}$ deg$^{-1}$) | 2.1 | 2.5 | 2.1 | 2.5 | 2.5 | 1.9 | 2.0 | 2.0 |
| Flexural strength [25° C.] (MPa) | 140 | 101 | 161 | 91 | 103 | 167 | 158 | 144 |
| Modulus of elasticity [25° C.] (GPa) | 10.8 | 10.3 | 10.1 | 10.3 | 10.3 | 10.1 | 11.3 | 10.7 |
| Water absorption degree [85° C., 85% 168H] (ppm) | 1049 | 2700 | 1120 | 2315 | 2315 | 995 | 1006 | 1010 |

|  | Comp. Ex. | | | |
|---|---|---|---|---|
|  | 1 | 2 | 3 | Ref. Ex. |
| Moldability | | | | |
| External apparece | ○ | ○ | ○ | ○ |
| Stain of cavity | ○ | ○ | ○ | ○ |
| Filling property of package | ○ | ○ | ○ | ○ |
| Compression molding time | 20 | 20 | 20 | 20 |

TABLE 4-continued

| General characteristics | | | | |
|---|---|---|---|---|
| Adhesivity to lead frame/Penetration distance (mm) | 2.8 | 5.5 | 4.6 | 1.2 |
| Glass transition point (° C.) | 89 | 90 | 87 | 85 |
| Thermal expansion coefficient ($\times 10^{-5}$ deg$^{-1}$) | 2.6 | 2.3 | 2.5 | 2.1 |
| Flexural strength [25° C.] (MPa) | 89 | 117 | 96 | 130 |
| Modulus of elasticity [25° C.] (GPa) | 10.3 | 12.3 | 10.6 | 10.6 |
| Water absorption degree [85° C., 85% 168H] (ppm) | 1350 | 1200 | 1150 | 1632 |

In Table 4, the mark "○" denotes the results explained below in the evaluations of the outer appearance of the molded body, the smear of cavity and the packing degree of the package.

The outer appearance of the molded body: Excellent in outer appearance after 100 times of continuous shot.

The smear of cavity: The smear of cavity was not recognized after 100 times of continuous shot.

The packing degree of the package: The generation of unfilled portion was not recognized in 100 shots of molding.

TABLE 5

| | Example | | | | | | | |
|---|---|---|---|---|---|---|---|---|
| Reliability test | 1 | 2 | 3 | 4 | 5 | 6 | 7 | 8 |
| Deformation of bonding wire (%) | 2.5 | 2.0 | 7.3 | 8.9 | 6.5 | 8.6 | 1.6 | 2.0 |
| Thermal shock test (cycles) [−65° C.–150° C.] | | | | | | | | |
| 50 cycles | 0/20 | 0/20 | 0/20 | 0/20 | 0/20 | 0/20 | 0/20 | 0/20 |
| 100 cycles | 0/20 | 0/20 | 0/20 | 0/20 | 0/20 | 0/20 | 0/20 | 0/20 |
| 200 cycles | 0/20 | 0/20 | 0/20 | 0/20 | 0/20 | 0/20 | 0/20 | 0/20 |
| 400 cycles | 0/20 | 2/20 | 0/20 | 1/20 | 1/20 | 0/20 | 0/20 | 0/20 |
| Moisture resistance reliability 125° C. 2.5 atm | | | | | | | | |
| 100 hours | 0/20 | 0/20 | 0/20 | 0/20 | 0/20 | 0/20 | 0/20 | 0/20 |
| 200 hours | 0/20 | 0/20 | 0/20 | 0/20 | 0/20 | 0/20 | 0/20 | 0/20 |
| 400 hours | 0/20 | 0/20 | 0/20 | 0/20 | 0/20 | 0/20 | 0/20 | 0/20 |
| 500 hours | 0/20 | 1/20 | 1/20 | 0/20 | 1/20 | 0/20 | 0/20 | 0/20 |

| | Comp. Ex. | | | |
|---|---|---|---|---|
| Reliability test | 1 | 2 | 3 | Ref. EX. |
| Deformation of bonding wire (%) | 12.3 | 18.4 | 20.5 | 2.5 |
| Thermal shock test (cycles) [−65° C.–150° C.] | | | | |
| 50 cycles | 0/20 | 0/20 | 0/20 | 3/20 |
| 100 cycles | 3/20 | 1/20 | 1/20 | 12/20 |
| 200 cycles | 3/20 | 4/20 | 4/20 | 18/20 |
| 400 cycles | 11/20 | 8/20 | 8/20 | 20/20 |
| Moisture resistance reliability 125° C. 2.5 atm | | | | |
| 100 hours | 0/20 | 0/20 | 0/20 | 12/20 |
| 200 hours | 1/20 | 2/20 | 2/20 | 20/20 |

TABLE 5-continued

| 400 hours | 2/20 | 6/20 | 6/20 | — |
| 500 hours | 6/20 | 13/20 | 12/20 | — |

As seen from Table 4, all of the resin compositions in Examples 1 to 8 (this invention), Comparative Examples 1 to 3 and Reference Example indicated an excellent moldability. However, the effect of titania whisker incorporated in the resin composition of this invention was apparently manifested in the general characteristics. Namely, when the resin compositions of Comparative Examples were employed for encapsulating a semiconductor chip, the adhesive force of the resin layer to the lead frame and to the semiconductor chip was very weak so that the distance of penetration of red ink at the suspension pin was extended up to 5.5 mm at maximum. Whereas, the resin compositions of this invention indicated an excellent adhesive force so that the distance of penetration of red ink at the suspension pin was mostly limited to at most 0.3 mm. With respect to flexural strength, the resin composition of this invention indicated an improvement in general.

Moreover, since the resin composition of this invention is highly fluid, i.e. low in viscosity, the deformation of bonding wire was only 1.6% at most, and the generation of defective wire was not recognized in the thermal shock cycle test or in the moisture reliability test. By contrast, in the case of the resin compositions of Comparative Examples, the deformation of bonding wire was enlarged up to as large as 20.5%, while almost a half of the samples became defective after 400 cycles in the thermal shock cycle test and almost a half of the samples became defective after a lapse of 500 hours of moisture resistance reliability test. It will be seen from these results that the semiconductor devices which were encapsulated with a resin composition which did not contain titania whisker indicated a poor reliability.

The results of Reference Example where a PPS resin with a high content of ionic impurities was employed for encapsulating the semiconductor device were also shown in Table 4.

Although the resin composition of this invention was employed in this example for manufacturing a DIP type package, it is also possible to employ the resin composition of this invention for the manufacture of a surface packaging such as flip chip or BGA (ball grid array).

Figure 4:
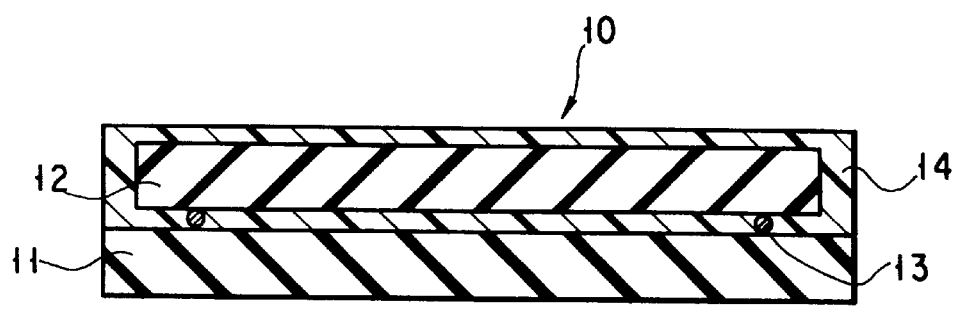
FIG. 4 is a cross-sectional view showing another example of a resin-encapsulated semiconductor device according to this invention.

FIG. 4 illustrates the cross-sectional view of another example of the resin-encapsulated semiconductor device. The resin-encapsulated semiconductor device 10 shown in FIG. 4 comprises a semiconductor chip 12, which are mounted via a bump 13 on a substrate 11, and the space between the semiconductor chip 12 and the substrate 11 as well as the peripheral portion of the semiconductor chip are sealed with a resin layer 14 which is consisting of a cured resin composition of this invention. This resin-encapsulated semiconductor device 10 can be manufactured by means of an injection molding, a hot impregnation method or a hot compression molding method employing sheets.

(EXAMPLE I-2)

Fillers and resins were mixed together in accordance with the formulations shown in the following Tables 6 and 7. Specifically, a filler was put into a Henschel mixer to stir it at a rotation speed of 5,000 rpm and, at the same time, subjected to a coupling treatment with stirring. Then, a PPS resin was added to the filler and the resultant mixtures were further stirred to obtain a homogeneous powder of PPS resin composition as indicated in Tables 6 and 7 as Examples 9 to 15 and as Comparative Examples 4 to 6.

Then, each powdery resin composition was kneaded and extruded by making use of a double-screw extruder heated to a temperature of 280 to 310° C. and provided with a 6-hole die. The resin thus kneaded and discharged from the 6-hole die was cooled with water and then cut in a predetermined size by making use of a pelletizer thereby obtaining a resin pellet.

TABLE 6

|  | Example | | | | | | |
| --- | --- | --- | --- | --- | --- | --- | --- |
|  | 9 | 10 | 11 | 12 | 13 | 14 | 15 |
| PPS-6 | 40 | 40 | 40 | 20 |  | 40 | 40 |
| PPS-7 |  |  |  |  |  |  |  |
| PPS-8 |  |  |  | 20 | 20 |  |  |
| PPS-9 |  |  |  |  | 20 |  |  |
| PPS A |  |  |  |  |  |  |  |
| Spherial silica A Average particle diameter 22 μm | 48 | 48 | 48 | 48 | 48 | 42.7 | 31.9 |
| Spherial silica B average particle diameter 0.5 μm | 5.4 | 5.4 | 5.4 | 5.4 | 5.4 | 4.7 | 3.5 |
| Aluminum borate A | 6 |  |  | 6 | 6 | 12 | 24 |
| Aluminum borate B |  | 6 |  |  |  |  |  |
| Aluminum borate C |  |  | 6 |  |  |  |  |
| Carbon black | 0.3 | 0.3 | 0.3 | 0.3 | 0.3 | 0.3 | 0.3 |
| Epoxy silane coupling agent A-187 | 0.3 | 0.3 | 0.3 | 0.3 | 0.3 | 0.3 | 0.3 |

TABLE 7

|  | Comp. Ex. 4 | Comp. Ex. 5 | Comp. Ex. 6 |
| --- | --- | --- | --- |
| PPS-6 | 40 |  |  |
| PPS-7 |  |  |  |
| PPS-8 |  | 20 |  |
| PPS-9 |  | 20 |  |
| PPS-A |  |  | 40 |
| Spherical silica A Average particle diameter 22 μm | 54 | 54 | 54 |
| Spherical silica B Average particle diameter 0.5 μm | 6 | 6 | 6 |
| Aluminum borate A |  |  |  |
| Aluminum borate B |  |  |  |
| Aluminum borate C |  |  |  |
| Carbon black | 0.3 | 0.3 | 0.3 |
| Epoxy silane coupling agent A-187 | 0.3 | 0.3 | 0.3 |

The values shown in Tables 6 and 7 denote the mixed contents of the components, which are indicated by % by weight.

The code numbers shown in these tables represent respectively a PPS resin illustrated below.

PPS-6: Linear polymer type LN-01G (a product from Tonen Kagaku Inc.)

PPS-7: Linear polymer type LN-02G (a product from Tonen Kagaku Inc.)

PPS-8: Branched polymer type LV-01 (a product from Tonen Kagaku Inc.)

PPS-9: Linear polymer type LJ-03G (a product from Tonen Kagaku Inc.)

PPS-A: Linear polymer type; a low viscosity type

The concentrations of $Na^+$ ion and $Cl^-$ ion in these PPS resins are summarized in Table 8 below.

TABLE 8

| Neat resin | $Na^+$ ion (ppm) | $Cl^-$ ion (ppm) |
| --- | --- | --- |
| PPS-6 | 24 | 30 |
| PPS-7 | 27 | 45 |
| PPS-8 | 51 | 61 |
| PPS-9 | 32 | 46 |
| PPS-A | 1560 | 875 |

As seen from Table 8, the PPS resin (PPS-A) mixed in the resin composition of Comparative Example indicated an extremely high concentration of ionic impurities.

The aluminum borate whiskers (A) to (C) which were mixed in the compositions of Examples 9 to 15 were all 0.5 to 10 μm in thickness of fiber and 1 to 30 μm in length of fiber.

Each pellet thus obtained was allowed to dry at a temperature of 150° C. for 20 hours, and then each pellet was charged into a screw preplasticating type vertical injection molding machine provided with a DIP 14-pin die thereby to encapsulate a test semiconductor element (a 2 mm square chip) with a resin as shown in FIG. 1. The molding in this case was performed under the conditions: 310° C. in melting temperature; and 400 kg/cm$^2$ in injection pressure with a die temperature of 170° C. The compression time was set respectively as shown in the following Tables 9 and 10. The molding was performed by making use of a die which was designed for forming each test piece and under the same molding conditions.

After the semiconductor device thus obtained was checked to see if there was any defective, the outer appearance of the molded body, the smear of cavity and the packing degree of the package were investigated. In this case, the outer appearance of the molded body was evaluated by the observation of the surface of the package by making use of a microscope to see if there is any sink mark or shrinkage void thereon. The smear of cavity was evaluated by repeating 50 shots of the same molded product by making use of a single mold and by observing the surface of the cavity. The packing degree of the package was evaluated by checking the package to see if there is any unfilled portion by making use of a microscope.

The compression molding time in this example was determined in such a manner as to meet the following conditions. Namely, the compression molding time was set to such that the release of a molded product from the mold would not be hindered and a continuous molding could be performed. The adhesion between the resin layer and a Cu frame in each package was determined as follows. Namely, a 2 mm square molded body was adhered on the surface of a Cu lead frame substrate and then the adhesive strength under shear of the molded body was measured.

Further, a red ink test was performed in the same manner as illustrated in the aforementioned Example (I-1) thereby to measure the penetration distance of ink into a region of suspension pin.

Furthermore, the glass transition Point, thermal expansion coefficient, flexural strength, modulus of elasticity and water absorption of each resin composition were measured in the same manner as illustrated in Example (I-1). At the same time, the melting viscosity of each resin composition was measured under a load of 30 kg by making use of an elevated flow tester (Shimazu Seisakusho Inc.).

The results obtained are summarized together with the evaluation on the moldability in the following Tables 9 and 10.

In Tables 9 and 10, the mark "○" denotes the results explained below in the evaluations of the outer appearance of the molded body, the smear of cavity and the packing degree of the package.

The outer appearance of the molded body: Excellent in outer appearance after 50 times of continuous shot.

The smear of cavity: The smear of cavity was not recognized after 50 times of continuous shot.

The packing degree of the package: The generation of unfilled portion was not recognized in 50 shots of molding.

The packages obtained by making use of the resin compositions of Examples 9 to 15 and Comparative Examples 4

TABLE 9

|  | Example 9 | Example 10 | Example 11 | Example 12 | Example 13 | Example 14 | Example 15 |
|---|---|---|---|---|---|---|---|
| External apparece | ○ | ○ | ○ | ○ | ○ | ○ | ○ |
| Stain of cavity | ○ | ○ | ○ | ○ | ○ | ○ | ○ |
| Filling property of package | ○ | ○ | ○ | ○ | ○ | ○ | ○ |
| Compression molding time (sec) | 7 | 7 | 7 | 10 | 10 | 7 | 7 |
| Adhesivity to Cu frame (Mpa) | 2 | 6 | 5 | 10 | 9 | 5 | 8 |
| Adhesivity to Cu lead frame/Red ink test [Distance of penetration (mm) at suspension pin] | 0 | 0 | 0 | 0 | 0 | 0 | 0 |
| Glass transition point (° C.) | 90.4 | 90.2 | 89.4 | 89 | 85.7 | 89.8 | 90.1 |
| Thermal expansion coefficient ($\times 10^{-5}$ deg$^{-1}$) | 2.3 | 2.3 | 2.1 | 2.3 | 2.1 | 2.1 | 2.1 |
| Flexural strength [25° C.] (Mpa) | 110 | 119 | 120 | 122 | 128 | 125 | 132 |
| Modulus of elasticity [25° C.] (Gpa) | 10.2 | 10.2 | 10.3 | 10.5 | 10.6 | 10.9 | 11.1 |
| Water absorption degree [85° C., 85%, 168H] (ppm) | 1076 | 1014 | 1026 | 1108 | 1183 | 1076 | 1096 |

TABLE 10

|  | Comp. Ex. 4 | Comp. Ex. 5 | Comp. Ex. 6 |
|---|---|---|---|
| External apparece | ○ | ○ | ○ |
| Stain of cavity | ○ | ○ | ○ |
| Filling property of package | ○ | ○ | ○ |
| Compression molding time (sec) | 7 | 15 | 15. |
| Adhesivity to Cu frame (MPa) | 0 | 0 | 0 |
| Adhesivity to Cu lead frame/Red ink test [Distance of penetration (mm) at suspension pin] | 5.8 | 3.9 | 7.2 |
| Glass transition point (° C.) | 91.3 | 87 | 85 |
| Thermal expansion coefficient ($\times 10^{-5}$ 1/° C.) | 2.4 | 2.3 | 2.4 |
| Flexural strength [25° C.] (MPa) | 84 | 113 | 81 |
| Modulus of elasticity [25° C.] (GPa) | 10.2 | 10.5 | 10.2 |
| Water absorption degree [85° C., 85% 168H] (ppm) | 1089 | 1198 | 1209 | to 6 were examined by means of X-ray photographing thereby to see any drifting of bonding wire to determine any deformation of bonding wire. Then, 20 pieces of sample were subjected to 20 to 500 times of thermal shock cycle, each cycle consisting of changes in temperature of −65° C. to room temperature to 150° C., to check the operating characteristic of the device thereby to investigate the percent defective of the device.

Furthermore, the moisture resistance of the package was also evaluated by making use of a pressure checker. Specifically, each package was left to stand for a prescribed period of time in a 2.5 atm. saturated water vapor heated to a temperature of 127° C., and the percent defective (leak defective or open defective) of the device after every predetermined period time was investigated, thereby evaluating the moisture resistance of the package.

The results of these reliability tests are summarized in Tables 11 and 12 shown below.

TABLE 11

|  | Example 9 | Example 10 | Example 11 | Example 12 | Example 13 | Example 14 | Example 15 |
|---|---|---|---|---|---|---|---|
| Deformation of bonding wire (%) | 6.3 | 4.2 | 4.2 | 3.8 | 5.5 | 6.7 | 7.3 |
| Thermal shock cycle test (−65°–150° C.) (cycle) number of defective/ number of tested | | | | | | | |
| 20 cycles | 0/20 | 0/20 | 0/20 | 0/20 | 0/20 | 0/20 | 0/20 |
| 50 cycles | 0/20 | 0/20 | 0/20 | 0/20 | 0/20 | 0/20 | 0/20 |
| 100 cycles | 0/20 | 0/20 | 0/20 | 0/20 | 0/20 | 0/20 | 0/20 |

TABLE 11-continued

|  | Example 9 | Example 10 | Example 11 | Example 12 | Example 13 | Example 14 | Example 15 |
|---|---|---|---|---|---|---|---|
| 200 cycles | 0/20 | 0/20 | 0/20 | 0/20 | 0/20 | 0/20 | 0/20 |
| 500 cycles | 0/20 | 0/20 | 0/20 | 0/20 | 0/20 | 0/20 | 0/20 |
| Moisture resistance reliability test (125° C., 2.5 atm) number of defective/ number of sample tested | | | | | | | |
| 50 hours | 0/20 | 0/20 | 0/20 | 0/20 | 0/20 | 0/20 | 0/20 |
| 100 hours | 0/20 | 0/20 | 0/20 | 0/20 | 0/20 | 0/20 | 0/20 |
| 200 hours | 0/20 | 0/20 | 0/20 | 0/20 | 0/20 | 0/20 | 0/20 |
| 500 hours | 0/20 | 0/20 | 0/20 | 0/20 | 0/20 | 0/20 | 0/20 |
| 1000 hours | 0/20 | 0/20 | 0/20 | 0/20 | 0/20 | 0/20 | 1/20 |

TABLE 12

|  | Comp. Ex. 4 | Comp. Ex. 5 | Comp. Ex. 6 |
|---|---|---|---|
| Deformation of bonding wire (%) | 7.5 | 8.2 | 8.4 |
| Thermal shock cycle test (−65°–150° C.) (cycle) number of defective/ number of tested | | | |
| 20 cycles | 0/20 | 0/20 | 3/20 |
| 50 cycles | 2/20 | 0/20 | 11/20 |
| 100 cycles | 4/20 | 1/20 | 13/20 |
| 200 cycles | 6/20 | 3/20 | 20/20 |
| 500 cycles | 14/20 | 6/20 | |
| Moisture resistance reliability test (125° C., 2.5 atm) number of defective/ number of sample tested | | | |
| 50 hours | 0/20 | 0/20 | 8/20 |
| 100 hours | 0/20 | 0/20 | 14/20 |
| 200 hours | 0/20 | 0/20 | 20/20 |
| 500 hours | 2/20 | 1/20 | |
| 1000 hours | 3/20 | 4/20 | |

As seen from the results shown in Tables 9 and 10, all of the resin compositions in Examples 9 to 15 (this invention) and Comparative Examples 4 to 6 indicated an excellent moldability. However, the effect of aluminum borate whisker incorporated in the resin composition of this invention was apparently manifested in the general characteristics. Namely, when the resin compositions of Comparative Examples were employed for encapsulating a semiconductor device, the adhesive force of the resin layer to the lead frame and to the semiconductor element was very weak so that the distance of penetration of red ink at the suspension pin was extended up to 7.2 mm at maximum. Whereas, the resin compositions of this invention indicated an excellent adhesive force so that the distance of penetration of red ink at the suspension pin was mostly limited to almost 0 mm. With respect to flexural strength, the resin composition of this invention indicated an improvement in general.

Moreover, as shown in Tables 11 and 12, in the case of the resin composition of this invention, only a negligible deformation of bonding wire was recognized, and the generation of defective was not recognized in the thermal shock cycle test or in the moisture reliability test. By contrast, in the case of the resin compositions of Comparative Examples, the deformation of bonding wire was enlarged up to as large as 8.4%, while almost all of the samples became defective after 200 cycles in the thermal shock cycle test and most of the samples became defective after a lapse of 500 hours of moisture resistance reliability test. It will be seen from these results that the semiconductor devices which were encapsulated with a resin composition which did not contain aluminum borate whisker indicated a poor reliability.

(EXAMPLE II)

This example explains a polyphenylene sulfide resin composition which comprises, in addition to a polyphenylene sulfide resin and an inorganic filler, a specific kind of compound so as to improve the adhesivity thereof to a lead frame or a semiconductor element (device).

The polyphenylene sulfide (PPS) resin to be employed in this example is a thermoplastic resin comprising a repeating unit represented by the following general formula (2) that can be classified generally into two types, i.e. a linear type and a crosslinking type. The linear type PPS resin is formed of a compound where a plurality of the repeating units each represented by the following general formula (2) are linearly connected with each other.

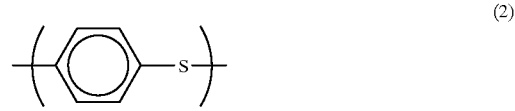

(2)

On the other hand, the crosslinking type PPs resin is formed of a compound, which can be manufactured by a well known method, e.g. by catalytically polymerizing dihalobenzene with an alkali-metal bisulfide in a polar solvent thereby to obtain a polymer, which is then heated in an oxygen-containing atmosphere to cause the polymer to undergo crosslinking, thus making it into a high polymer. Specifically, the crosslinking type PPS resin can be represented by the following structures (3) and (4).

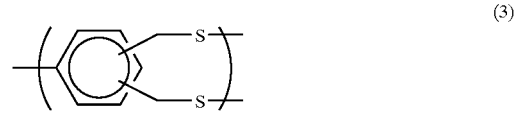

(3)

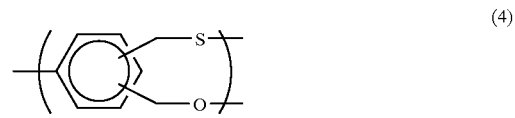

(4)

The PPS resin to be employed in this example may be selected from any of the aforementioned formulas (2) to (4).

It is also possible for these PPS resins to contain in its structure other kinds of linkage such as a meta linkage, an ether linkage, a substituted phenyl sulfide linkage, etc. Examples of unit that can be contained in the structure of PPS resins are structural units represented by the following general formulas (5) to (13). However, the ratio of these structural units in the PPS polymer should preferably be limited to less than 30 mol. %. Because, if the ratio of these structural units in the PPS polymer exceeds over 30 mol. %, the crystallinity of the resultant polymer would be badly affected, thus inviting the deterioration in heat resistance of the polymer.

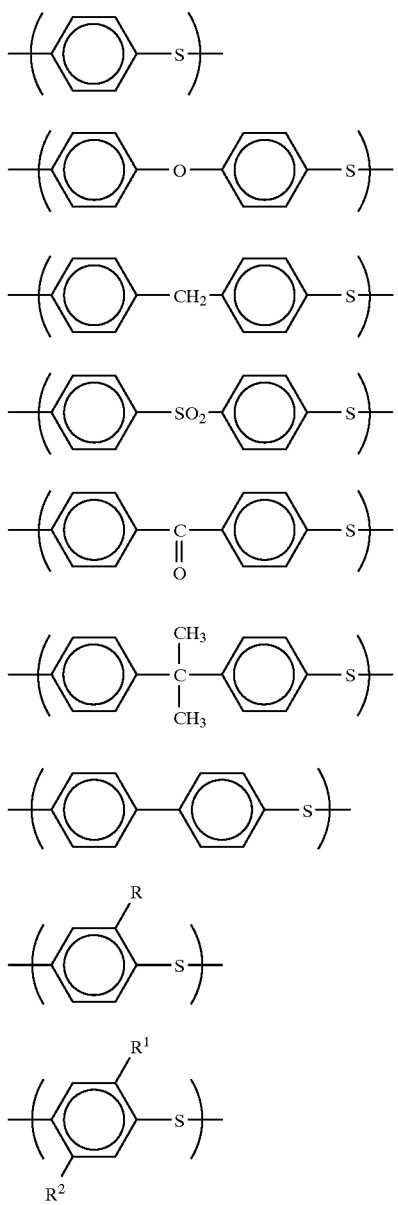

wherein R, $R^1$ and $R^2$ may be the same or different and are individually alkyl group, nitro group, carboxylic group, amino group, a group of metal salt of carboxylic acid, or alkoxyl group.

The linear type PPS resin can be synthesized through a condensation reaction between p-dichlorobenzene and sodium sulfide as shown in the following reaction formula.

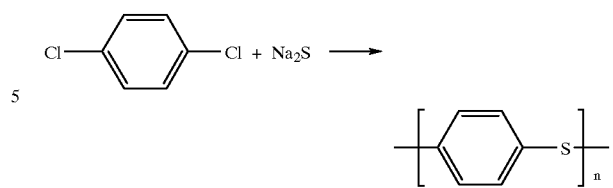

wherein n is an integer of 10 or more.

These PPS resins are low in both hygroscopicity and dielectric constant, so that the adhesivity of the resin to a metal such as a lead frame can be improved, thus making it suitable for use in encapsulating a semiconductor device.

It is also possible to employ the same kinds of PPS resin as employed in Example I.

It is preferable to incorporate an inorganic filler in the PPS resin in view of improving the mechanical strength of the resin such as the strength of resin, impact resistance.

Examples of the inorganic filler are fused silica powder, crystalline silica powder, glass fiber, talc, alumina powder, silicon nitride powder, aluminum nitride powder, calcium silicate powder, calcium carbonate powder, barium sulfate powder and magnesia.

Among them, fused silica powder, crystalline silica powder and glass fiber, singly or in combination thereof, are most preferable in view of moisture resistance and reliability when they are used for encapsulating a semiconductor element. If silica powder is to be employed, it may be used as a mixture consisting, in an appropriate mixing ratio, of fragmental, spherical and fine powdery silica.

The mixing ratio of the aforementioned inorganic filler in the resin composition should preferably be 20 wt % to 85 wt %, more preferably 60 wt % to 80 wt %. If the mixing ratio of the inorganic filler is less than 20 wt %, the moldability of the resultant resin composition where a PPS resin of low viscosity is employed would be deteriorated, and at the same time, it would be impossible to obtain a molded product exhibiting a sufficient degree of heat resistance and impact resistance. On the other hand, if the mixing ratio of the inorganic filler exceeds over 85 wt %, it is impossible to wet the inorganic filler with the resin so that the melting viscosity of the resin composition would be extremely increased, whereby inviting a deformation or breaking of bonding wire.

It is preferable for the purpose of improving the moisture resistance of the molded product to perform the surface treatment of the inorganic filler. In this surface treatment, any kind of silane coupling agent can be employed as long as it is useful in the ordinary surface treatment. Specific examples of such a silane coupling agent are epoxy silane, amino silane, mercapto silane and acryl silane.

The mixing ratio of silane coupling agent to the inorganic filler should preferably be 0.02 wt % to 10 wt % based on the weight of the inorganic filler. If the mixing ratio of the silane coupling agent is less than 0.02 wt %, the effect of the coupling agent such as an improvement in strength of a molded product can be hardly attained. On the other hand, if the mixing ratio of silane coupling agent to the inorganic filler exceeds over 10 wt % based on the weight of the inorganic filler, the moisture resistance and reliability of a molded product would be deteriorated.

Next, explanations on the compounds to be included as the (c) component of the resin composition of this example will be set forth. Namely, this (c) component functions to improve the adhesivity of the resin composition, and is composed of at least one compound selected from a polymer of indene, phenol aralkyl resin and novolak phenol resin.

The indene polymer may be a homopolymer or a copolymer. When an indene copolymer is to be employed, the ratio of indene monomer to other comonomer should preferably be set to meet the condition of I/S ≧1.5 (where I represents the number of moles of indene monomer, and S denotes the number of moles of other comonomer) in view of improving the adhesivity of resin composition. Namely, if the content of indene monomer meets the condition of I/S ≧1.5, the tackiness inherent to indene can be fully exhibited thereby improving the adhesivity of the resin composition. However, if the ratio I/S is less than 1.5, it would become difficult to make the most of the effect of indene.

As for the comonomer to be copolymerized with indene, a vinyl aromatic monomer such as styrene, vinylnaphthalene and vinylbiphenyl is preferable in view of its excellent moisture resistance.

The polymers mentioned above can be synthesized by means of cationic polymerization employing a Friedel-Crafts catalyst, or by means of a thermal polymerization employing a high temperature of 250° C. or more. The indene polymer obtained in this manner is low in hygroscopicity and in dielectric constant just like the PPS resin. Therefore, when an indene polymer is added to the PPS resin, the hygroscopicity as well as dielectric constant of the resultant resin composition would be further lowered. As a result, the adhesivity between the resin layer and a metallic member such as a lead frame would be increased. The employment of this indene polymer is also effective in lowering the melting viscosity at the molding temperature of the resin composition. Namely, since the fluidity of the resin composition is enhanced by the employment of the indene polymer, the inorganic filler can be incorporated in an increasing ratio thereby improving the strength of resin and the impact resistance of the molded product. Furthermore, the dimension stability of the molded product can be improved by the employment of the indene polymer, and in particular, the employment of the indene polymer is effective in preventing the generation of sink mark on the molded product where a PPS resin of low molecular weight is employed.

The mixing ratio of the indene polymer to the PPS resin should preferably be 5 wt % to 50 wt % based on the PPS resin. If the mixing ratio of the indene polymer is less than 5 wt %, the adhesivity of the resin to a semiconductor element would become poor since the indene polymer can be hardly exposed on the surface of the molded product, thus resulting in a deterioration in reliability of the semiconductor device. On the other hand, if the mixing ratio of indene polymer exceeds over 50 wt %, the indene polymer is caused to decompose violently, thus deteriorating the heat resistance of the resin composition.

The phenol aralkyl resin to be incorporated as (c) component into the resin composition of this example is a resin to be obtained through a reaction between aralkyl ether and phenol with an employment of a Friedel-Crafts catalyst, so that this resin is also known as Friedel-Crafts resin. Specific example of this resin is a condensation polymer compound to be derived from the reaction between α, α'-dimethoxy-p-xylene and phenol (Plastics, Vol.34, No.2, pp 85). Specific examples of such a condensation polymer compound are XL-225, XL-225L, XL-225LL, XL-2253L and XL-2254L (all being products of Mitsui Toatsu Kagaku Co.); and MEH-7800L and 7800LL (all being products of Meiwa Kasei Co.).

As for the aforementioned novolak phenol resin, there is no limitation, provided that it contains two or more phenolic hydroxide groups in one molecule. For example, phenol novolak resin, cresol novolak resin, tert-butylphenol novolak resin, nonylphenol novolak resin, cyclopentadiene phenol novolak resin and naphthalene novolak resin may be employed. These phenol novolak resin may contain a reactive group such as allyl group, acryl group, vinyl group or mercapto group. It is also possible to a biphenyl type phenol resin (MEH-7850, MEH-7851 and MEH-7860; Meiwa Kasei Co.) with a view to suppress an increase of water absorption.

The mixing ratio of the aforementioned phenol aralkyl resin or novolak phenol resin to the PPS resin should preferably be 0.1 wt % to 20 wt % based on the PPS resin. If the mixing ratio of these resins is less than 0.1 wt %, it will become difficult to obtain a sufficient effect of these resins. On the other hand, if the mixing ratio of these resins is less than 20 wt %, the moisture resistance would become lower and the moisture resistance reliability would be deteriorated, as a result, it would be impossible to obtain a desired mechanical strength.

If required, the resin composition of this example may contain a releasing agent such as a natural wax, a synthetic wax, a linear aliphatic acid or a metallic salt thereof, acid amide, esters and paraffines; a pigment such as carbon black and titanium dioxide; and a modifying agent such as silicone oil, silicone gel, silicone rubber, plastic powder of various kinds, engineering plastic powder of various kinds, ABS resin powder and MBS resin powder.

The resin composition of this example can be prepared by making use of a hot roll, a kneader or an extruder so as to melt and knead the resin composition, by making use of a special mixer capable of atomizing the resin composition; or by a combination of any of these methods. Most typical method of preparing the resin composition is to dry-blend all of the components by means of a mixer, and then to melt and mix the PPS resin and the inorganic filler by means of an extruder, the extruded product being subsequently cut into pellets.

The resin composition thus prepared can be employed, as in the case of the ordinary composition comprising a resin and an inorganic filler, as a sealing material for electric or electronic parts, as a structural material for mechanical parts such as a gear or a bearing, or as a material for various housings.

The resin-encapsulating semiconductor device according to this example can be easily manufactured by encapsulating a semiconductor element with the aforementioned resin composition. Most common method of encapsulating a semiconductor element with the resin composition is a low pressure transfer molding method. However, the encapsulation of a semiconductor element with the resin composition can be performed by means of an injection molding, a compression molding or a casting method.

(EXAMPLE II-1)

Each component was combined in accordance with the formulations shown in the following Table 13 to prepare the resin compositions of Examples 16 to 19 and Comparative Examples 7 to 9.

TABLE 13

|  | Example | | | | Comp. Ex. | | |
| --- | --- | --- | --- | --- | --- | --- | --- |
|  | 16 | 17 | 18 | 19 | 7 | 8 | 9 |
| PPS resin | 33.7 | 33.7 | 32.7 | 31.1 | 36.6 | 36.6 | 49.7 |
| Indene resin A | 3.4 | — | — | — | — | — | — |
| Indene resin B | — | 3.4 | 6.6 | 6.2 | — | — | — |
| Filler A | 42.2 | 42.2 | 40.4 | 37 | 42.3 | 42.3 | — |
| Filler B | 20 | 20 | 20 | 25 | 20.4 | 20.4 | 49.6 |
| Surface treatment agent | 0.3 | 0.3 | 0.3 | 0.3 | 0.3 | 0.3 | 0.3 |
| Pigment | 0.4 | 0.4 | 0.4 | 0.4 | 0.4 | 0.4 | 0.4 |

The values shown in Table 13 are based on % by weight.

The components employed herein are explained as follows.

Polyphenylene sulfide resin: (melting viscosity, 10 Pa·S; Toray Industries Inc.)

Inorganic filler:

Filler A1 (fused silica powder, S-CO; average particle diameter, 22 μm; Micron Co. Ltd.)

Filler B1 (glass fiber, REVX-2008; average particle diameter, 13 μm; average length, 50–60 μm; Nihon Itagarasu Co. Ltd.)

Indene resin A (indene homopolymer; softening point, 144° C.)

Indene resin B (indene-styrene copolymer, I-120; softening point, 120° C.; I/S=4.2; Shin-Nittetsu Kagaku Inc.)

Surface treating agent: (silane coupling agent, A-187; Nippon Unicar Co., Ltd.)

The indene homopolymer was prepared by the process wherein indene was sufficiently purified at first, then polymerized using $TiCl_3Bu$ as a catalyst and washed several times with methanol to prepare the aimed indene homopolymer.

The preparation of the resin composition was performed as follows. Specifically, a fused silica powder was put into a Henschel mixer and surface-treated using a silane coupling agent. Then, other components were charged into the Henschel mixer and mixed together. Thereafter, the resultant mixture was kneaded and extruded by making use of a double-screw extruder heated to a temperature of 280 to 330° C., and then cut into pellets. The pellets thus obtained was charged into an injection molding machine (IS-100FB, Toshiba Kikai Co. Ltd.) to encapsulate a test piece for measuring three-point flexural strength and a test semiconductor element of 14-pin DIP structure with the resin under the conditions of: 330° C. in resin temperature and 150° C. in die temperature.

Figure 5:
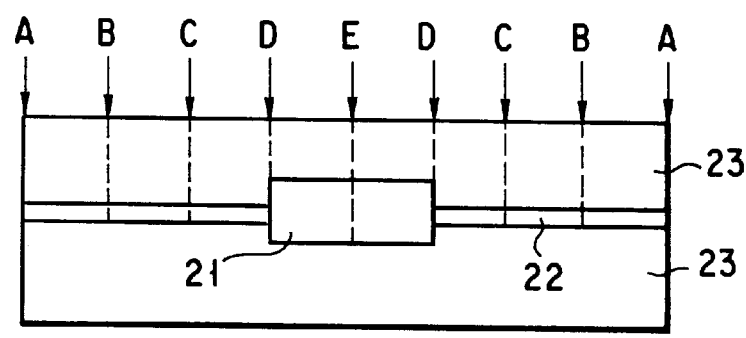
FIG. 5 is a cross-sectional view showing another example of a resin-encapsulated semiconductor device wherein a test sample of semiconductor element is sealed with a resin composition of Example II.

FIG. 5 illustrates a schematic view of a resin-encapsulated semiconductor device which was obtained by sealing the test element with the resin composition of this example. Referring to FIG. 5, the reference numeral 21 is a chip of the test device and 22 denotes a lead frame of the test device. The chip 21 and the lead frame 22 are encapsulated with a resin composition 23. "A" to "E" in FIG. 5 will be explained hereinafter.

On the other hand, as Comparative Examples 7 to 9, resin compositions not containing the indene resin as indicated by the formula shown in Table 13 were treated and pelletized. Specifically, Comparative Example 7 was performed in the same manner as explained above Examples to encapsulate the semiconductor element. In Comparative Examples 8 and 9, a lead frame coated in advance with an epoxy adhesive (Epicoat 191; Yuka Shell Epoxy Inc.) was encapsulated.

The following tests were performed using these encapsulated products.

(1) Melting viscosity:

The melting viscosity was measured using an elevated flow tester (pore diameter of die: 1.0 mm, and pore length of die: 2.0 mm) under the conditions of 310° C. and 10 kg load.

(2) Molding shrinkage:

The molding shrinkage in the longitudinal direction of test piece for testing a flexural strength was measured.

(3) Sink mark on a molded product:

A flat surface portion of the molded product was exposed to light so as to determine any sink mark on the surface of the molded product by observing the reflected light with naked eyes.

(4) Adhesivity test:

The test device was treated with a fluorescent liquid (NEOGLO, F-4A-E, Eishin Kagaku Co. Ltd.) at room temperature in vacuo for 10 minutes. Subsequently, the penetration degree of the fluorescent liquid from the interface of the lead frame was measured by observing it with a polarization microscope. Further, the test device was subjected to 100 times of repeated thermal shock (−65° C. to 150° C.) by making use of a thermal shock cycle tester (TCT tester), and then the penetration degree of the fluorescent liquid was observed in the same manner as explained above.

(5) Deformation of bonding wire:

The magnitude in deformation of bonding wire of the encapsulated test device was observed by making use of an X-ray photographing device.

(6) Thermal shock cycle test:

The encapsulated test device was subjected at first to 100 times of repeated thermal shock (−65° C. to 150° C.) by making use of a TCT tester, and then the percent defective of the test device was investigated.

The results of these tests are summarized in the following Table 14. As for the sink mark, the test device where no sink mark was recognized on its surface was indicated by the mark "○", and the test device where a lot of sink marks were recognized on its surface was indicated by the mark "X" in this Table. As for the penetration degree of the fluorescent liquid, the marks "A" (negligible) to "E" (prominent) were employed for indicating the magnitude of the penetration of the fluorescent liquid. The magnitude in deformation of the bonding wire is expressed by a deformation ratio, i.e. the device which exhibited less than 10% of deformation ratio is indicated by a double circle; the device which exhibited 10% to less than 20% of deformation ratio is indicated by a single circle; the device which exhibited 20% or more of deformation ratio is indicated by a triangular shape; and the device whose bonding wire was broken is indicated by "X" mark.

TABLE 14

|  | Example | | | | Comp. Ex. | | |
| --- | --- | --- | --- | --- | --- | --- | --- |
|  | 16 | 17 | 18 | 19 | 7 | 8 | 9 |
| Melting viscosity (Pa · s) | 165 | 170 | 135 | 105 | 230 | 230 | 80 |
| Flexural strength (MPa) | 138 | 141 | 129 | 123 | 120 | 120 | 72 |
| Molding shrinkage (%) | 0.5 | 0.7 | 0.6 | 0.6 | 1.0 | 1.0 | 1.6 |
| Sink mark | ○ | ○ | ○ | ○ | x | x | x |
| Penetration degree of fluorescent liquid before thermal shock | A | A | A | A | C | A | B |

TABLE 14-continued

|  | Example | | | | Comp. Ex. | | |
|---|---|---|---|---|---|---|---|
|  | 16 | 17 | 18 | 19 | 7 | 8 | 9 |
| Penetration degree of fluorescent liquid after thermal shock | A | A | B | C | E | D | D |
| TCT test | 0/10 | 0/10 | 0/10 | 2/10 | 1/10 | 0/10 | 1/10 |
| Ratio of deformation of bonding wire | ◯ | ◯ | ◯ | ⊚ | x | x | Δ |

As shown in Table 14, the resin compositions of Examples 16 to 19 were low in melting viscosity, excellent in fluidity and high in flexural strength, i.e. excellent in mechanical features as compared with those of Comparative Examples 7 to 9. Further, the resin compositions of Examples 16 to 19 were low in molding shrinkage, free from sink mark and excellent in dimension stability. Furthermore, the resin compositions of Examples 16 to 19 were low in penetration degree of the fluorescent liquid, excellent in adhesivity with the lead frame, excellent in thermal shock resistance, and almost free from the breaking or deformation of the bonding wire. As explained above, the resin compositions of Examples 16 to 19 were generally excellent as compared with those of Comparative Examples 7 to 9.

(EXAMPLE II-2)

Fillers and resins were mixed together in accordance with the formulations shown in the following Tables 15 and 16. Specifically, a filler was put into a Henschel mixer to stir it at a rotation speed of 4,000 rpm and, at the same time, subjected to a coupling treatment with stirring. Then, a PPS resin was added to the filler and the resultant mixtures were further stirred to obtain a homogeneous powder of PPS resin composition as indicated in Tables 15 and 16 as Examples 20 to 26 and as Comparative Examples 10 to 12.

Then, each powdery resin composition was kneaded and extruded by making use of a double-screw extruder heated to a temperature of 280 to 310° C. and provided with a 6-hole die. The resin thus kneaded and discharged from the 6-hole die was cooled with water and then cut in a predetermined size by making use of a pelletizer thereby obtaining a resin pellet.

TABLE 16

|  | Comp. Ex. 10 | Comp. Ex. 11 | Comp. Ex. 12 |
|---|---|---|---|
| PPS-6 | 39.4 | | |
| PPS-7 | | | |
| PPS-8 | | 39.4 | |
| PPS-9 | | | |
| PPS-A | | | 39.4 |
| Spherical silica A Average particle diameter 22 μm | 54 | 54 | 54 |
| Spherical silica B Average particle diameter 0.5 μm | 6 | 6 | 6 |
| Carbon black | 0.3 | 0.3 | 0.3 |
| Epoxy silane coupling agent A-187 | 0.3 | 0.3 | 0.3 |
| Phenol resin | | | |
| Phenol aralkyl resin | | | |

The values shown in Tables 15 and 16 denote the mixed contents of the components, which are indicated by % by weight.

The code numbers shown in these tables represent respectively a PPS resin illustrated below.

PPS-6: Linear polymer type LN-01G (a product from Tonen Kagaku Inc.)

PPS-7: Linear polymer type LN-02G (a product from Tonen Kagaku Inc.)

PPS-8: Branched polymer type LV-01 (a product from Tonen Kagaku Inc.)

PPS-9: Linear polymer type LJ-03G (a product from Tonen Kagaku Inc.)

PPS-A: Linear polymer type; a low viscosity type

Since the PPS resins (PPS-6 to PPS-9 and PPS-A) employed in this Example II-2 were the same as those employed in Example I-2, the concentrations of $Na^+$ ion and $Cl^-$ ion in these PPS resins are the same shown in Table 8.

The phenol resin and phenol aralkyl resin incorporated into the resin compositions of Examples 20 to 26 were as follows.

Phenol resin: BRG557

Phenol aralkyl resin: XL-225L

Each pellet thus obtained was allowed to dry at a temperature of 150° C. for 20 hours, and then each pellet was charged into a screw preplasticating type vertical injection molding machine provided with a DIP 14-pin die thereby to encapsulate a test semiconductor element (a 2 mm square chip) with a resin as shown in FIG. 1. The molding in this

TABLE 15

|  | Example 20 | Example 21 | Example 22 | Example 23 | Example 24 | Example 25 | Example 26 |
|---|---|---|---|---|---|---|---|
| PPS-6 | 38.9 | | | | | 19.45 | 38.9 |
| PPS-7 | | 38.9 | | | | | |
| PPS-8 | | | 38.9 | | 19.45 | 19.45 | |
| PPS-9 | | | | 38.9 | 19.45 | | |
| PPS-A | | | | | | | |
| Spherical silica A Average particle diameter 22 μm | 54 | 54 | 54 | 54 | 54 | 54 | 54 |
| Spherical silica B Average particle diameter 0.5 μm | 6 | 6 | 6 | 6 | 6 | 6 | 6 |
| Carbon black | 0.3 | 0.3 | 0.3 | 0.3 | 0.3 | 0.3 | 0.3 |
| Epoxy silane coupling agent A-187 | 0.3 | 0.3 | 0.3 | 0.3 | 0.3 | 0.3 | 0.3 |
| Phenol resin | | | | | | | 0.5 |
| Phenol aralkyl resin | 0.5 | 0.5 | 0.5 | 0.5 | 0.5 | 0.5 | | case was performed under the conditions: 310° C. in melting temperature; and 400 kg/cm² in injection pressure with a die temperature of 170° C. The compression time was set respectively as shown in the following Tables 17 and 18. The molding was performed by making use of a die which was designed for forming each test piece and under the same molding conditions.

After the semiconductor device thus obtained was checked to see if there was any defective, the outer appearance of the molded body, the smear of cavity and the packing degree of the package were investigated. In this case, the outer appearance of the molded body was evaluated by the observation of the surface of the package by making use of a microscope to see if there is any sink mark or shrinkage void thereon. The smear of cavity was evaluated by repeating 50 shots of the same molded product by making use of a single mold and by observing the surface of the cavity. The packing degree of the package was evaluated by checking the package to see if there is any unfilled portion by making use of a microscope.

The compression molding time in this example was determined in such a manner as to meet the following conditions. Namely, the compression molding time was set to such that the release of a molded product from the mold would not be hindered and a continuous molding could be performed. The adhesion between the resin layer and a Cu frame in each package was determined as follows. Namely, a 2 mm square molded body was adhered on the surface of a Cu lead frame substrate and then the adhesive strength under shear of the molded body was measured.

Further, a red ink test was performed in the same manner as illustrated in the aforementioned Example (I-1) thereby to measure the penetration distance of ink into a region of suspension pin.

Furthermore, the glass transition Point, thermal expansion coefficient, flexural strength, modulus of elasticity and water absorption of each resin composition were measured in the same manner as illustrated in Example (I-1). At the same time, the melting viscosity of each resin composition was measured under a load of 30 kg by making use of an elevated flow tester (Shimazu Seisakusho Inc.).

The results obtained are summarized together with the evaluation on the moldability in the following Tables 17 and 18.

TABLE 18

|  | Comp. Ex. 10 | Comp. Ex. 11 | Comp. Ex. 12 |
|---|---|---|---|
| External apparece | ○ | ○ | ○ |
| Stain of cavity | ○ | ○ | ○ |
| Filling property of package | ○ | ○ | ○ |
| Compression molding time (sec) | 7 | 15 | 15 |
| Adhesivity to Cu frame (kg/mm²) | 0 | 0 | 0 |
| Red ink test [Distance of penetration (mm) at suspension pin] | 5.8 | 3.9 | 7.2 |
| Glass transition point (° C.) | 91.3 | 87 | 85 |
| Thermal expansion coefficient ($\times 10^{-5}$ 1/° C.) | 2.2 | 2.3 | 2.4 |
| Flexural strength [25° C.] (MPa) | 97 | 86 | 81 |
| Modulus of elasticity [25° C.] (Gpa) | 10.2 | 10.1 | 10.2 |
| Water absorption degree [85° C., 85%, 168H] (ppm) | 1149 | 1198 | 1209 |

In Tables 17 and 18, the mark "○" denotes the results explained below in the evaluations of the outer appearance of the molded body, the smear of cavity and the packing degree of the package.

The outer appearance of the molded body: Excellent in outer appearance after 50 times of continuous shot.

The smear of cavity: The smear of cavity was not recognized after 50 times of continuous shot.

The packing degree of the package: The generation of unfilled portion was not recognized in 50 shots of molding.

The packages obtained by making use of the resin compositions of Examples 20 to 26 and Comparative Examples 10 to 12 were examined by means of X-ray photographing thereby to see any drifting of bonding wire to determine any deformation of bonding wire. Then, 20 pieces of sample were subjected to 20 to 500 times of thermal shock cycle, each cycle consisting of changes in temperature of −65° C. to room temperature to 150° C., to check the operating characteristic of the device thereby to investigate the percent defective of the device.

Furthermore, the moisture resistance of the package was also evaluated by making use of a pressure checker. Specifically, each package was left to stand for a prescribed period of time in a 2.5 atm. saturated water vapor heated to a temperature of 127° C., and the percent defective (leak

TABLE 17

|  | Example 20 | Example 21 | Example 22 | Example 23 | Example 24 | Example 25 | Example 26 |
|---|---|---|---|---|---|---|---|
| External apparece | ○ | ○ | ○ | ○ | ○ | ○ | ○ |
| Stain of cavity | ○ | ○ | ○ | ○ | ○ | ○ | ○ |
| Filling property of package | ○ | ○ | ○ | ○ | ○ | ○ | ○ |
| Compression molding time (sec) | 7 | 7 | 15 | 15 | 10 | 10 | 7 |
| Adhesivity to Cu frame (kg/mm²) | 0.7 | 0.6 | 2.5 | 1.8 | 2.5 | 2.2 | 0.5 |
| Red ink test [Distance of penetration (mm) at suspension pin] | 0 | 0 | 0 | 0 | 0 | 0 | 0 |
| Glass transition point (° C.) | 89.5 | 90.2 | 87.5 | 89 | 85.7 | 89.8 | 90.1 |
| Thermal expansion coefficient ($\times 10^{-5}$ 1/° C.) | 2.2 | 2.3 | 2.1 | 2.3 | 2.1 | 2.1 | 2.2 |
| Flexural strength [25° C.] (MPa) | 105 | 106 | 87 | 123 | 117 | 103 | 108 |
| Modulus of elasticity [25° C.] (GPa) | 10.1 | 10.1 | 9.9 | 10.5 | 10.4 | 10.9 | 10.6 |
| Water absorption degree [85° C., 85%, 168H] (ppm) | 1159 | 1142 | 1211 | 1108 | 1183 | 1137 | 1279 | defective or open defective) of the device after every predetermined period time was investigated, thereby evaluating the moisture resistance to the package.

The results of these reliability tests are summarized in Tables 19 and 20 shown below.

that the distance of penetration of red ink at the suspension pin was mostly limited to almost 0 mm. With respect to flexural strength, the resin composition of this invention indicated an improvement in general.

TABLE 19

|  | Example 20 | Example 21 | Example 22 | Example 23 | Example 24 | Example 25 | Example 26 |
|---|---|---|---|---|---|---|---|
| Deformation of bonding wire (%) | 5.3 | 8.4 | 4.2 | 9.7 | 5.3 | 4.5 | 3.2 |
| Thermal shock cycle test (−65°–150° C.) (cycle) number of defective/ number of tested |  |  |  |  |  |  |  |
| 20 cycles | 0/20 | 0/20 | 0/20 | 0/20 | 0/20 | 0/20 | 0/20 |
| 50 cycles | 0/20 | 0/20 | 0/20 | 0/20 | 0/20 | 0/20 | 0/20 |
| 100 cycles | 0/20 | 0/20 | 0/20 | 0/20 | 0/20 | 0/20 | 0/20 |
| 200 cycles | 0/20 | 0/20 | 0/20 | 0/20 | 0/20 | 0/20 | 0/20 |
| 500 cycles | 0/20 | 0/20 | 0/20 | 1/20 | 0/20 | 0/20 | 0/20 |
| Moisture resistance reliability test (125° C., 2.5 atm) number of defective/ number of sample tested |  |  |  |  |  |  |  |
| 50 hours | 0/20 | 0/20 | 0/20 | 0/20 | 0/20 | 0/20 | 0/20 |
| 100 hours | 0/20 | 0/20 | 0/20 | 0/20 | 0/20 | 0/20 | 0/20 |
| 200 hours | 0/20 | 0/20 | 0/20 | 0/20 | 0/20 | 0/20 | 90/20 |
| 500 hours | 0/20 | 0/20 | 0/20 | 0/20 | 0/20 | 0/20 | 0/20 |
| 1000 hours | 0/20 | 0/20 | 0/20 | 0/20 | 0/20 | 0/20 | 0/20 |

TABLE 20

|  | Comp. Ex. 10 | Comp. Ex. 11 | Comp. Ex. 12 |
|---|---|---|---|
| Deformation of bonding wire (%) | 7.5 | 6.8 | 8.4 |
| Thermal shock cycle test (−65°–150° C.) (cycle) number of defective/ number of tested |  |  |  |
| 20 cycles | 0/20 | 0/20 | 3/20 |
| 50 cycles | 4/20 | 1/20 | 11/20 |
| 100 cycles | 8/20 | 5/20 | 13/20 |
| 200 cycles | 18/20 | 7/20 | 20/20 |
| 500 cycles | 20/20 | 13/20 |  |
| Moisture resistance reliability test (125° C., 2.5 atm) number of defective/ number of sample tested |  |  |  |
| 50 hours | 2/20 | 1/20 | 8/20 |
| 100 hours | 7/20 | 2/20 | 14/20 |
| 200 hours | 13/20 | 4/20 | 20/20 |
| 500 hours | 20/20 | 12/20 |  |
| 1000 hours |  | 15/20 |  |

As seen from the results shown in Tables 17 and 18, all of the resin compositions in Examples 20 to 26 (this invention) and Comparative Examples 10 to 12 indicated an excellent moldability. However, the effect of the compound to promote adhesivity (component "C") which was incorporated in the resin composition of this invention was apparently manifested in the general characteristics. Namely, when the resin compositions of Comparative Examples were employed for encapsulating a semiconductor element, the adhesive force of the resin layer to the lead frame and to the semiconductor element was very weak so that the distance of penetration of red ink at the suspension pin was extended up to 7.2 mm at maximum. Whereas, the resin compositions of this invention indicated an excellent adhesive force so Moreover, as shown in Tables 19 and 20, in the case of the resin composition of this invention, only a negligible deformation of bonding wire was recognized, and the generation of defective was not recognized in the thermal shock cycle test or in the moisture reliability test. By contrast, in the case of the resin compositions of Comparative Examples, the deformation of bonding wire was enlarged up to as large as 8.4%, while almost all of the samples became defective after 200 cycles in the thermal shock cycle test and most of the samples became defective after a lapse of 500 hours of moisture resistance reliability test. It will be seen from these results that the semiconductor devices which were encapsulated with a resin composition which did not contain phenol aralkyl resin and/or novolak phenol resin indicated a poor reliability.

(EXAMPLE III)

In this example, a specific kind of PPS resin was employed, and the ratio of fine inorganic filler in the entire inorganic filler was confined to a specific ratio so as to improve the adhesivity of the PPS resin composition.

The PPS resin to be employed in this example is fundamentally a thermoplastic resin comprising a repeating unit represented by the aforementioned general formula (2).

This PPS resin can be manufactured by any of known methods as shown for example in Japanese Patent Publication S/45-3368 or S/52-12240, or Japanese Patent Unexamined Publication S/61-7332. The polyphenylene sulfide resin can be structurally classified generally into three types, i.e. a linear type, a crosslinking type and a branched type. The linear type polyphenylene sulfide resin is formed of a compound where a plurality of the repeating units each represented by the following general formula (2) are linearly connected with each other.

On the other hand, the crosslinking type polyphenylene sulfide resin is formed of a compound, which is manufactured by catalytically polymerizing dihalobenzene with an alkali-metal bisulfide in a polar solvent. The branched type polyphenylene sulfide resin is formed of a branched molecular chain structure, which can be synthesized by introducing trihalobenzene into the repeating unit in the aforementioned manufacturing method. Especially, it is preferable in this example that at least 30 wt % of the polyphenylene sulfide resin is occupied by this branched polyphenylene sulfide resin.

It is also possible for these PPS resins to contain in its structure other kinds of linkage such as a meta linkage, an ether linkage, a substituted phenyl sulfide linkage, etc. Examples of unit that can be contained in the structure of PPS resins are structural units represented by the general formulas (5) to (11), which are already explained in the previous Example II. However, the ratio of these structural units in the PPS polymer should preferably be limited to less than 30 mol. %. Because, if the ratio of these structural units in the PPS polymer exceeds over 30 mol. %, the crystallinity and heat resistance of the resultant polymer would be badly affected, thus making it difficult to assure a satisfactory mechanical characteristics of the polymer. More preferably, the ratio of these structural units in the PPS polymer should be limited less than 10 mol. %.

It is also possible to employ PPS resin which is copolymerized with mono-, di- or tri-halobenzene whose one or two hydrogen atoms in its phenyl group are substituted by methyl group, ethyl group, carboxylic group or amino group can be employed as long as there is not any problem with regard to crystallinity.

The PPS resin to be incorporated into the resin composition of this example contains a specific kind of PPS resin which exhibits a non-Newtonian index (n) of 1.1 or more. In the measurement of the non-Newtonian index (n), a shearing stress (SS) in relative to changes (SR) in shear rate was first measured using a capillography under the conditions of: 330° C. and L/D=10, and then, based on the measurements, the value of non-Newtonian index (n) was calculated according to the following equation (1).

$$SR = K \cdot SS^n \qquad (1)$$

If non-Newtonian index (n) is less than 1.1, it would be impossible to obtain a resin composition exhibiting an excellent adhesion to a metal member such as a lead frame. Therefore, it is required to incorporate a PPS resin whose non-Newtonian index (n) is 1.1 or more. Furthermore, in order to assure a sufficient adhesion to a metallic member, the mixing ratio of this specific polyphenylene sulfide resin should preferably be 30 wt % or more based on the PPS resin matrix.

The PPS resin exhibiting a non-Newtonian index (n) of 1.1 or more has following characteristics. Namely, when the temperature of this PPS resin is lowered at a rate of 20° C./min., an exothermic peak due to DSC is observed at a temperature ranging from 200° C. to 225° C. If the exothermic peak is less than 200° C., the molding cycle becomes longer in time, thus deteriorating the productivity. On the other hand, when the exothermic peak exceeds over 225° C., the adhesion of the PPS resin to a metal member would become poor.

The method of measuring this exothermic peak of the resin can be carried out as follows. First of all, 5 mg of PPS resin is heated up to 330° C. at a rate of 20° C./min. by means of DSC and kept at this temperature for 10 minutes. Then, the PPS resin thus heated is cooled down to 100° C. at a rate of 20° C./min., thereby allowing a crystallization exotherm to generate during the cooling, thus making it possible to measure the peak temperature.

Examples of PPS resin having the aforementioned characteristics are LV-01G and LV-02G (Tohpren Co., Ltd.).

As mentioned above, the mixing ratio of this specific PPS resin should preferably be 30 wt % or more based on the entire PPS resin matrix. As for other kinds of PPS resin, they may be of any of the aforementioned structures, but should preferably be of substantially non-crosslinking or linear structure, or of branched structure.

In view of the insulating property or of the moisture resistance reliability when the resin composition is to be employed for manufacturing a resin-encapsulated semiconductor device, these PPS resins should preferably be free from ionic impurities such as Na and Cl in particular. The purification of these PPS resins can be performed in the same manner as explained above (Example I).

As for the kind of inorganic filler to be mixed with the resin composition of this example, fundamentally all of the materials explained in Example I, such as fused silica, crystalline silica, glass fiber, etc. may be employed. However, because of the same reason as explained above, fused silica and crystalline silica are most preferable irrespective of whether they are used individually or in combination. As for the shape of the inorganic filler, it may be fragmental, spherical, semi-spherical, fibrous or flaky, but spherical or semi-spherical inorganic filler is most preferable.

The aforementioned inorganic filler should contain fine inorganic filler having an average particle diameter of 1 $\mu$m or less in an amount of 5 to 40 wt % based on the entire inorganic filler. If the content of the fine inorganic filler is less than 5 wt %, the generation of burr may become prominent. On the other hand, when the content of the fine inorganic filler exceeds over 40 wt %, the fluidity of the resin composition would be lowered. Most preferable content of this fine inorganic filler having an average particle diameter of 1 $\mu$m or less is in the range of 7 to 30 wt % based on the total weight of the inorganic filler.

Examples of the inorganic filler are fused silica powder, crystalline silica powder, glass fiber, talc, alumina powder, silicon nitride powder, aluminum nitride powder, boron nitride powder, calcium silicate powder, calcium carbonate powder, barium sulfate powder, magnesia powder, magnesium oxide powder, beryllium oxide powder and mica.

Among them, fused silica powder, crystalline silica powder and glass fiber, singly or in combination thereof, are most preferable in view of moisture resistance and reliability when they are used for encapsulating a semiconductor element. These inorganic fillers should preferably be spherical in shape.

Specific examples of inorganic filler having an average particle diameter of 1 $\mu$m or less are Adma-fine SO-25R, SO-25RA and SO-25HA (products of Admatechs Co., Ltd.)

It is also possible to employ a fibrous inorganic filler for the purpose of improving the reinforcing effect of inorganic filler. Examples of fibrous inorganic filler are whiskers, amorphous fibers and crystalline fibers which are exemplified in the aforementioned Example I. In view of facilitating the filling of the fibrous inorganic fiber, the average thickness of the fiber should preferably be 20 $\mu$m or less and the maximum thickness of the fiber should preferably be 100 $\mu$m or less.

There is any particular restriction regarding the inorganic filler to be mixed with the resin composition of this example as long as it contains a predetermined ratio of fine inorganic filler having an average particle diameter of 1 $\mu$m or less. These inorganic fillers may be employed singly or in a suitable combination.

The mixing ratio of the aforementioned inorganic filler to the resin should preferably be 25 to 80 wt % based on the entire weight of the resin composition. If the mixing ratio of the inorganic filler is less than 25 wt %, the moldability of the resultant resin composition would be deteriorated, prominently generating burr, and at the same time, it would become difficult to obtain a molded product exhibiting a sufficient degree of thermal shock resistance. On the other hand, if the mixing ratio of the inorganic filler exceeds over 80 wt %, the melting viscosity of the resin composition would be extremely increased, whereby inviting a deformation or breaking of bonding wire. More preferable mixing ratio of the inorganic filler is 40 to 70 wt % based on the entire resin composition.

It is preferable for the purpose of improving the moisture resistance of the molded product to perform the surface treatment of the inorganic filler. In this surface treatment, any kind of coupling agent can be employed as long as it is useful in the ordinary surface treatment. Specific examples of such a coupling agent are an organosilicic coupling agent such as epoxy silane, amino silane, mercapto silane and acryl silane; a Ti-based coupling agent; an Al-based coupling agent; and a Zr-based coupling agent. The mixing ratio of these coupling agents to the inorganic filler should preferably be 0.02 wt % to 10 wt % based on the weight of the inorganic filler.

The resin composition of this example may contain, in addition to the aforementioned components, various kinds of additives as mentioned in the previous Example II. Further, if required, an anti-oxidant, a heat stabilizer, a corrosion inhibitor, an ultraviolet inhibitor, a crystallization accelerator, a fluidizing agent and a burr inhibitor may be incorporated into the resin composition.

The resin composition of this example may be prepared in the same manner as explained in the aforementioned Example II. Further, the resin composition thus prepared can be employed in various end-uses as in the case of the ordinary resin composition comprising a resin and an inorganic filler.

Next, this example will be further explained in detail with reference the following specific examples.

Each component was combined in accordance with the formulations shown in the following Table 21 to prepare the resin compositions of Examples 27 to 31 and Comparative Examples 13 to 17.

The values shown in Table 21 are based on weight parts. The components employed herein are explained as follows.

PPS resin AA: LV-01 (Tohpren Co., Ltd.); non-Newtonian index (n)=1.12; crystallization temperature=221° C.

PPS resin BB: LN-03G (Tohpren Co., Ltd.); non-Newtonian index (n)=1.01; crystallization temperature=258° C.

Fused silica powder AA: S-CO; average particle diameter=22 μm (Micron Co. Ltd.)

Fused silica powder BB: SO-25R; average particle diameter=0.5 μm (Micron Co. Ltd.)

Silane coupling agent: A-187 (epoxy silane coupling agent); (Nippon Unicar Co., Ltd.)

The preparation of the resin composition was performed as follows. Specifically, a fused silica powder was put into a Henschel mixer and surface-treated using a silane coupling agent. Then, other components were charged into the Henschel mixer and mixed together. Thereafter, the resultant mixture was kneaded and extruded by making use of a double-screw extruder heated to a temperature of 280 to 330° C., and then cut into pellets. The pellets thus obtained was charged into a vertical injection molding machine (MIPS-30, Meiho Co. Ltd.) to encapsulate a test piece for measuring three-point flexural strength and a test semiconductor element of 14-pin DIP structure with the resin under the conditions of: 330° C. in resin temperature and 150° C. in die temperature.

The resin-encapsulated semiconductor device which was obtained by sealing the test device with the resin composition of this example was the same as shown in FIG. 5.

On the other hand, as Comparative Examples 13 to 17, resin compositions containing neither the aforementioned specific kind of PPS resin nor the aforementioned fine inorganic filler as indicated by the formula shown in Table 21 were treated and pelletized in the same manner as in the case of the above example. In the case of Comparative Examples 16 and 17 however, a lead frame coated in advance with an epoxy adhesive (Epicoat 191; Yuka Shell Epoxy Inc.) was encapsulated.

The following tests were performed using these encapsulated products. The results obtained are shown in the following Table 22.

TABLE 21

| | Example | | | | | Comp. Ex. | | | | |
| --- | --- | --- | --- | --- | --- | --- | --- | --- | --- | --- |
| | 27 | 28 | 29 | 30 | 31 | 13 | 14 | 15 | 16 | 17 |
| PPS resin AA | 39.3 | 31.1 | 19.7 | 14.3 | 39.3 | 39.3 | 39.3 | | 4.0 | |
| PPS resin BB | | 8.2 | 19.6 | 25.3 | | | | 39.3 | 35.3 | 39.3 |
| Filler A | 54 | 54 | 54 | 54 | 48 | 60 | 30 | 54 | 54 | 60 |
| Filler B | 6 | 6 | 6 | 6 | 12 | | 30 | 6 | 6 | |
| Surface treatment agent | 0.3 | 0.3 | 0.3 | 0.3 | 0.3 | 0.3 | 0.3 | 0.3 | 0.3 | 0.3 |
| Pigment | 0.4 | 0.4 | 0.4 | 0.4 | 0.4 | 0.4 | 0.4 | 0.4 | 0.4 | 0.4 |

TABLE 22

|  | Example | | | | | Comp. Ex. | | | | |
| --- | --- | --- | --- | --- | --- | --- | --- | --- | --- | --- |
|  | 27 | 28 | 29 | 30 | 31 | 13 | 14 | 15 | 16 | 17 |
| Melting viscosity (Pa · s) | 52.3 | 66.7 | 86.1 | 101.1 | 60.6 | 55.8 | 81.0 | 157.8 | 157.8 | 160.1 |
| Flexural strength (MPa) | 86 | 95 | 116 | 127 | 88 | 90 | 82 | 133 | 133 | 130 |
| Molding shrinkage (%) | 0.5 | 0.5 | 0.6 | 0.6 | 0.5 | 0.8 | 0.5 | 0.7 | 0.7 | 0.9 |
| Sink mark | ○ | ○ | ○ | ○ | ○ | ○ | ○ | x | x | x |
| Penetration degree of fluorescent liquid before thermal shock | A | A | A | A | A | A | A | D | B | B |
| Penetration degree of fluorescent liquid after thermal shock | A | A | B | C | A | B | C | E | D | D |
| TCT test | 1/10 | 0/10 | 0/10 | 0/10 | 1/10 | 3/10 | 5/10 | 1/10 | 4/10 | 10/10 |
| Ratio of deformation of bonding wire a) | ⊚ | ⊚ | ○ | ○ | ○ | Δ | Δ | x | x | x |
| Compact Filling property | ○ | ○ | ○ | ○ | ○ | x | x | x | x | x | a) ⊚; Deformation of 5% or less, ○; Deformation of 5% to 10%, Δ; Deformation of 10% to 15%, x; Deformation of 15% or more, or breaking of wire The features shown in Table 22 were evaluated by the procedures shown below.

(1) Melting viscosity:

The melting viscosity was measured using a capillograph (3A; Tohyo Seiki Seisakusho Inc.) under the conditions of 330° C. and L/D=10. The values of viscosity in this Table were obtained with the shear rate being set to 1,200 sec$^{-1}$.

(2) Molding shrinkage:

The molding shrinkage in the longitudinal direction of test piece for testing a flexural strength was measured.

(3) Sink mark on a molded product:

A flat surface portion of the molded product was exposed to light so as to determine any sink mark on the surface of the molded product by observing the reflected light with naked eyes. In this case, the test device where no sink mark was recognized on its surface was indicated by the mark "○", and the test device where a lot of sink marks were recognized on its surface was indicated by the mark "X" in this Table.

(4) Adhesivity test:

The test device was treated with a fluorescent liquid (NEOGLO, F-4A-E, Eishin Kagaku Co. Ltd.) at room temperature in vacuo for 10 minutes. Subsequently, the penetration degree of the fluorescent liquid from the interface of the lead frame was measured by observing it with a polarization microscope. Further, the test device was subjected to 100 times of repeated thermal shock (−65° C. to 150° C.) by making use of a thermal shock cycle tester (TCT tester), and then the penetration degree of the fluorescent liquid was observed in the same manner as explained above. As for the penetration degree of the fluorescent liquid, the marks "A" (negligible) to "E" (prominent) were employed for indicating the magnitude of the penetration of the fluorescent liquid.

(5) Deformation of bonding wire:

The magnitude in deformation of bonding wire of the encapsulated test device was observed by making use of an X-ray photographing device. In this case, the magnitude in deformation of the bonding wire is expressed by a deformation ratio, i.e. the device which exhibited less than 5% of deformation ratio is indicated by a double circle; the device which exhibited 5% to less than 10% of deformation ratio is indicated by a single circle; the device which exhibited 10% to less than 15% of deformation ratio is indicated by a triangular shape; and the device which exhibited 15% or more of deformation ratio, or whose bonding wire was broken is indicated by "X" mark.

(6) Thermal shock cycle test:

The encapsulated test device was subjected at first to 100 times of repeated thermal shock (−65° C. to 150° C.) by making use of a TCT tester, and then the percent defective of the test device was investigated.

(7) Test on filling property:

After finishing the molding of device by making use of a DIP 14-pin die, the filling degree of the resin composition into the die bar portion (indicated in FIG. 1 by the number 8) was observed. The mark "○" represents a case where the die bar portion was completely filled with the resin composition, whereas the mark "X" represents a case where the formation of burr was recognized or the die bar portion was incompletely filled with the resin composition.

As shown in Table 22, the resin compositions of Examples 27 to 31 were low in melting viscosity, excellent in fluidity and high in flexural strength, i.e. excellent in mechanical features as compared with those of Comparative Examples 13 to 17. Further, the resin compositions of Examples 27 to 31 were low in molding shrinkage, free from sink mark and excellent in dimension stability. Furthermore, the resin compositions of Examples 27 to 31 were low in penetration degree of the fluorescent liquid, excellent in adhesivity with the lead frame, excellent in thermal shock resistance, and almost free from the breaking or deformation of the bonding wire. As explained above, the resin compositions of Examples 27 to 31 were generally excellent as compared with those of Comparative Examples 13 to 17.

(EXAMPLE IV)

In this example, two kinds of PPS resin each differing in melting viscosity from each other were employed and mixed together, and at the same time, the content of inorganic filler was confined to a specific ratio so as to improve the mechanical strength of the PPS resin composition.

The PPS resin to be employed in this example is, as in the case of Example III, fundamentally a thermoplastic resin comprising a repeating unit represented by the aforementioned general formula (2). The PPS resin can be manufactured in the same manner as explained above.

The PPS resin to be incorporated into the resin composition of this invention is a mixture comprising a first PPS resin having a melting viscosity of 1 to 15 Pa·s, and a second PPS resin having a melting viscosity of 15 to 50 Pa·s, the mixing ratio of these resins being set to a predetermined range.

The first PPS resin (hereinafter being referred to as PPS-L) may be of any type, i.e. it may be a linear type, a crosslinked type or a branched type. The melting viscosity of PPS-L may be 1 to 15 Pa·s, more preferably 7 to 12 Pa·s as measured under the conditions of: 310° C. and 10 kg load. If the melting viscosity of PPS-L is less than 1 Pa·s, the moldability of the molten resin in the molding cycle would become deteriorated, and the mechanical property of the molded product may be also poor. On the other hand, if the melting viscosity of PPS-L exceeds over 15 Pa·s, it may be difficult to obtain a desired effects of this invention. Moreover, if a PPS resin having a melting viscosity of more than 15 Pa·S is employed as the first PPS resin, the fluidity of the resultant resin composition would be lowered when the ratio of the first PPS resin is higher than that of the second PPS resin.

Specific examples of PPS resin that can be employed as the first PPS resin having the aforementioned range of melting viscosity are LN-01G, H-0, H-1, LV-01G, LV-02G, etc. (all being products of Topren Co., Ltd.); M-3910 and L-3340 (all being products of Toray Industries Inc.); and EX-3192 (a product of Dainippon Ink and Chemicals Inc.).

The second polyphenylene sulfide resin (hereinafter being referred to as PPS-H) may be a linear type or a branched type, as long as the structure thereof is not of crosslinking structure and has a melting index of 15 to 50 Pa·s. If the melting viscosity of PPS-H is less than 15 Pa·s, it is impossible to obtain a molded product having an excellent mechanical strength. On the other hand, if the melting viscosity of PPS-H exceeds over 50 Pa·s, the fluidity of the resultant resin composition would be lowered. However, if a branched type PPS resin is to be employed, it is preferably to select a PPS resin (PPS-H) having a melting viscosity of 25 Pa·s or more.

Preferably examples of PPS resin that can be employed as the second PPS resin having the aforementioned range of melting viscosity are those having a linear structure and a crystallization temperature of 235° C. or more, a most preferable example of the second PPS resin being a linear type PPS resin containing 0.5 to 10 mol. % of m-phenylene sulfide unit. Specific examples of PPS resin which meets the aforementioned conditions are LJ-03G and LW-03G (all being products of Topren Co., Ltd.).

As explained above, the PPS resin to be incorporated into the resin composition of this invention is a mixture comprising a first PPS resin (PPS-L) and a second PPS resin (PPS-H). There is any particular limitation regarding mixing ratio between (PPS-L) and (PPS-H) as long as the mixing ratio meets the following conditions:

(PPS-L)≧10 wt %

(PPS-H)≧20 wt %

(PPS-L)+(PPS-H)=100 wt %

If the ratio of PPS-L is less than 10 wt %, the fluidity of the resultant resin composition would be undesirably lowered. On the other hand, if the ratio of PPS-H is less than 20 wt %, it would be difficult to ensure a satisfactory mechanical property. More preferably mixing ratio of PPS-H is 50 wt % or more.

In this example, the high-temperature crystallization temperature of the PPS resin mixture consisting of the aforementioned ratios of PPS-L and PPS-H should preferably be to 220 to 240° C. This crystallization temperature was measured as follows. First of all, 5 mg of the mixture is heated up to 330° C. at a rate of 20° C./min. by means of DSC and kept at this temperature for 10 minutes. Then, the PPS resin mixture thus heated is cooled down to 100° C. at a rate of 20° C./min., thereby allowing a crystallization exotherm to generate during the cooling, thus making it possible to measure the peak temperature, which is defined as the crystallization temperature.

If the crystallization temperature of the PPS resin mixture is less than 220° C., the molding cycle becomes longer in time, thus deteriorating the productivity. On the other hand, when the crystallization temperature of the PPS resin mixture exceeds over 240° C., the adhesion of the PPS resin to a metal member would become poor. Thus, more preferably crystallization temperature of the PPS resin mixture is 225° C. to 236° C.

In view of the insulating property or of the moisture resistance reliability when the resin composition is to be employed for manufacturing a resin-encapsulated semiconductor device, these PPS resins should preferably be free from ionic impurities such as Na and Cl in particular. The purification of these PPS resins can be performed in the same manner as explained above (Example I).

The mixing ratio of this PPS resin mixture should preferably be confined to the range of 20 to 70 wt % based on the entire resin composition of this invention. Namely, if the mixing ratio of this PPS resin mixture is less than 20wt %, the effects such as fluidity which are inherent to the PPS resin can not be expected and the bonding wire may be caused to break. On the other hand, if the mixing ratio of this PPS resin mixture exceeds over 70 wt %, the molding shrinkage or thermal expansion coefficient may become large, thereby deteriorating the reliability of the semiconductor device. Thus, preferable mixing ratio of the PPS resin mixture is in the range of 30 to 65 wt %.

As for the kind of inorganic filler to be mixed with the resin composition of this example, fundamentally all of the materials explained in Example III, such as fused silica, crystalline silica, glass fiber, etc. may be employed. However, because of the same reason as explained above, fused silica and crystalline silica are most preferable irrespective of whether they are used individually or in combination. As for the shape of the inorganic filler, it may be fragmental, spherical, semi-spherical, fibrous or flaky, but spherical or semi-spherical inorganic filler is most preferable.

The mixing ratio of aforementioned inorganic filler should preferably be 30 to 80 wt % based on the entire resin composition. If the content of the inorganic filler is less than 30 wt %, the moldability of the resin composition would be deteriorated due to the generation of burr or it would be impossible to obtain a satisfactory thermal shock resistance. On the other hand, when the content of the inorganic filler exceeds over 80 wt %, the melting viscosity of the resin composition may be prominently increased thereby inviting a breaking of bonding wire. Thus, more preferable content of the inorganic filler would be in the range of 40 to 70 wt % based on the resin composition.

It is also possible to employ a fibrous inorganic filler for the purpose of improving the reinforcing effect of inorganic filler. Examples of fibrous inorganic filler are whiskers, amorphous fibers and crystalline fibers which are exemplified in the aforementioned Example I. In view of facilitating the filling of the fibrous inorganic fiber, the average thickness of the fiber should preferably be 20 $\mu$m or less and the maximum thickness of the fiber should preferably be 100 $\mu$m or less.

The aforementioned inorganic filler should preferably contain fine inorganic filler having an average particle diameter of 1 $\mu$m or less in an amount of 5 to 40 wt % based on the entire inorganic filler. If the content of the fine inorganic filler is less than 5 wt %, the burr may generate. On the other hand, when the content of the fine inorganic filler exceeds over 40 wt %, the fluidity of the resin composition would be lowered. Thus, more preferable content of this fine inorganic filler having an average particle diameter of 1 μm or less is in the range of 7 to 30 wt % based on the total weight of the inorganic filler.

Examples of such an inorganic filler are, as exemplified in Example III, fused silica powder, crystalline silica powder, glass fiber, etc. Among them, fused silica powder, crystalline silica powder and glass fiber, singly or in combination thereof, are most preferable in view of moisture resistance and reliability when they are used for encapsulating a semiconductor device. These inorganic fillers should preferably be spherical in shape.

Specific examples of inorganic filler having an average particle diameter of 1 μm or less are Adma-fine SO-25R, SO-25RA and SO-25HA (products of Admatechs Co., Ltd.)

It is preferable for the purpose of improving the moisture resistance of the molded product to perform the surface treatment of the inorganic filler by making use of a coupling agent as explained in Example III.

The resin composition of this example may contain, in addition to the aforementioned components, various kinds of additives as mentioned in the previous Example III. Further, if required, an anti-oxidant, a heat stabilizer, a corrosion inhibitor, an ultraviolet inhibitor, a crystallization accelerator, a fluidizing agent and a burr inhibitor may be incorporated into the resin composition.

The resin composition of this example may be prepared in the same manner as explained in the aforementioned Example II. Further, as explained in Example II, the resin composition thus prepared can be employed in various end-uses as in the case of the ordinary resin composition comprising a resin and an inorganic filler.

Next, this example will be further explained in detail with reference the following specific examples.

Each component was combined in accordance with the formulations shown in the following Table 23 to prepare the resin compositions of Examples 32 to 38 and Comparative Examples 18 to 23.

The components employed herein are explained as follows.

PPS resin L1: a linear type LN-01 (Tohpren Co., Ltd.); melting viscosity=11 Pa·s; crystallization temperature=255° C.

PPS resin L2: a linear type H-1 (Tohpren Co., Ltd.); melting viscosity=9 Pa·s; crystallization temperature=241° C.

PPS resin L3: a branch type LV-01 (Tohpren Co., Ltd.); melting viscosity=9 Pa·s; crystallization temperature=221° C.

PPS resin H1: a linear type LN-03G (Tohpren Co., Ltd.); melting viscosity=27 Pa·s; crystallization temperature=258° C.

PPS resin H2: a linear type LJ-03G (Tohpren Co., Ltd.); melting viscosity=26 Pa·s; crystallization temperature=227° C.

Fused silica powder AA: S-CO; average particle diameter=22 μm (Micron Co. Ltd.)

Fused silica powder BB: SO-25R; average particle diameter=0.5 μm (Micron Co. Ltd.)

Silane coupling agent: A-187 (epoxy silane coupling agent); (Nippon Unicar Co., Ltd.)

The aforementioned PPS resins (L1, L2 and L3) corresponds to the aforementioned first PPS resin, whereas the aforementioned PPS resins (H1 and H2) corresponds to the aforementioned second PPS resin.

The high-temperature crystallization temperature of the PPS resin mixtures which were mixed into the resin compositions of Examples 32 to 38 is summarized as follows.

| Examples | High-temperature crystallization temperature of the mixed resin |
|---|---|
| 32 | 255° C. |
| 33 | 251° C. |
| 34 | 231° C. |
| 35 | 235° C. |
| 36 | 233° C. |
| 37 | 226° C. |

The preparation of the resin composition was performed as follows. Specifically, a fused silica powder was put into a Henschel mixer and surfacetreated using a silane coupling agent. Then, other components were charged into the Henschel mixer and mixed together. Thereafter, the resultant mixture was kneaded and extruded by making use of a double-screw extruder heated to a temperature of 280 to 330° C., and then cut into pellets. The pellets thus obtained was charged into a vertical injection molding machine

TABLE 23

| | Example | | | | | | | Comp. Ex. | | | | | |
|---|---|---|---|---|---|---|---|---|---|---|---|---|---|
| | 32 | 33 | 34 | 35 | 36 | 37 | 38 | 18 | 19 | 20 | 21 | 22 | 23 |
| PPS resin L1 | 19.7 | | | 19.7 | | | 19.7 | 39.3 | | | | | |
| PPS resin L2 | | 19.7 | | | 19.7 | | | | 39.3 | | | | |
| PPS resin L3 | | | 19.7 | | | 19.7 | | | | 39.3 | | | |
| PPS resin H1 | 19.6 | 19.6 | 19.6 | | | | 19.6 | | | | 39.3 | | |
| PPS resin H2 | | | | 19.6 | 19.6 | 19.6 | | | | | | 39.3 | 34.3 |
| Filler AA | 54 | 54 | 54 | 54 | 54 | 54 | 60 | 54 | 54 | 54 | 54 | 54 | 58 |
| Filler BB | 6 | 6 | 6 | 6 | 6 | 6 | | 6 | 6 | 6 | 6 | 6 | 7 |
| Surface treatment agent | 0.3 | 0.3 | 0.3 | 0.3 | 0.3 | 0.3 | 0.3 | 0.3 | 0.3 | 0.3 | 0.3 | 0.3 | 0.3 |
| Pigment | 0.4 | 0.4 | 0.4 | 0.4 | 0.4 | 0.4 | 0.4 | 0.4 | 0.4 | 0.4 | 0.4 | 0.4 | 0.4 |

(MIPS-30, Meiho Co. Ltd.) to encapsulate a test piece for measuring three-point flexural strength and a test semiconductor device of 14-pin DIP structure with the resin under the conditions of: 330° C. in resin temperature and 150° C. in die temperature.

The resin-encapsulated semiconductor device which was obtained by sealing the test device with the resin composition of this example was the same as shown in FIG. 5.

The following tests were performed using these encapsulated products. The results obtained are shown in the following Table 24.

TABLE 24

|  | Example | | | | | | | Comp. Ex. | | | | | |
| --- | --- | --- | --- | --- | --- | --- | --- | --- | --- | --- | --- | --- | --- |
|  | 32 | 33 | 34 | 35 | 36 | 37 | 38 | 18 | 19 | 20 | 21 | 22 | 23 |
| Melting viscosity (Pa · s) | 88.1 | 76.9 | 78.7 | 84.6 | 75.3 | 75.2 | 82.2 | 67.0 | 59.0 | 58.0 | 151 | 133 | 240 |
| Flexural strength (MPa) | 126 | 125 | 121 | 117 | 120 | 116 | 120 | 97.0 | 88.2 | 82.1 | 123 | 120 | 121 |
| Molding shrinkage (%) | 0.5 | 0.6 | 0.6 | 0.5 | 0.6 | 0.6 | 0.6 | 1.0 | 1.1 | 0.9 | 0.8 | 0.8 | 0.5 |
| Sink mark | ○ | ○ | ○ | ○ | ○ | ○ | ○ | x | x | x | ○ | ○ | ○ |
| TCT test | 0/10 | 1/10 | 1/10 | 0/10 | 0/10 | 0/10 | 2/10 | 10/10 | 10/10 | 10/10 | 4/10 | 5/10 | 7/10 |
| Ratio of deformation of bonding wire a) | ○ | ○ | ⊚ | ○ | ⊚ | ⊚ | Δ | ○ | ⊚ | ⊚ | x | x | x |
| Filling property | ○ | ○ | ○ | ○ | ○ | ○ | x | x | x | x | x | x | x | a) ⊚; Deformation of 5% or less, ○; Deformation of 5% to 10%, Δ; Deformation of 10% to 15%, x; Deformation of 15% or more, or breaking of wire The features shown in Table 24 were evaluated by the procedures shown below.

(1) Melting viscosity:

The melting viscosity was measured using an elevated flow tester (pore diameter of die: 1.0 mm, and pore length of die: 2.0 mm) under the conditions of 310° C. and 10 kg load.

(2) Molding shrinkage:

The molding shrinkage in the longitudinal direction of test piece for testing a flexural strength was measured.

(3) Sink mark on a molded product:

A flat surface portion of the molded product was exposed to light so as to determine any sink mark on the surface of the molded product by observing the reflected light with naked eyes. In this case, the test device where no sink mark was recognized on its surface was indicated by the mark "○", and the test device where a lot of sink marks were recognized on its surface was indicated by the mark "X" in this Table.

(4) Deformation of bonding wire:

The magnitude in deformation of bonding wire of the encapsulated test device was observed by making use of an x-ray photographing device. In this case, the magnitude in deformation of the bonding wire is expressed by a deformation ratio, i.e. the device which exhibited less than 5% of deformation ratio is indicated by a double circle; the device which exhibited 5% to less than 10% of deformation ratio is indicated by a single circle; the device which exhibited 10% to less than 15% of deformation ratio is indicated by a triangular shape; and the device which exhibited 15% or more of deformation ratio, or whose bonding wire was broken is indicated by "X" mark.

(5) Thermal shock cycle test:

The encapsulated test device was subjected at first to 100 times of repeated thermal shock (−65° C. to 150° C.) by making use of a TCT tester, and then the percent defective of the test device was investigated.

(6) Test on filling property:

After finishing the molding of device by making use of a DIP 14-pin die, the filling degree of the resin composition into the die bar portion (indicated in FIG. 1 by the number 8) was observed. The mark "○" represents a case where the die bar portion was completely filled with the resin composition, whereas the mark "X" represents a case where the formation of burr was recognized or the die bar portion was incompletely filled with the resin composition.

As shown in Table 24, the resin compositions of Examples 32 to 38 were excellent in moldability, and were well balanced of mechanical strength and fluidity. Further, the resin compositions of Examples 32 to 38 were filled excellently into the die bar portion in the molding of DIP package, and the breaking or deformation of the bonding wire was not recognized, thus providing a device of excellent reliability.

As explained above, it is possible according to this invention to provide a PPS resin composition, which is excellent in adhesivity to other members of different kind, exhibits a mechanical strength after the curing thereof, and excellent in environmental stability and in flame retargency. Furthermore, the resin composition of this invention is advantageous in that it does not contain any toxic component which is harmful to environment, and is low in moisture absorption even in a high temperature and high humidity condition. Therefore, when a semiconductor device is encapsulated using this resin composition, it is possible to provide the resin-encapsulated semiconductor device with an excellent reliability for a long period of time. Furthermore, the resin composition of this invention is applicable to various fields in addition to the encapsulation of a semiconductor device, thus highly valuable in industrial view point.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A polyphenylene sulfide resin composition, which comprises;

(a) a polyphenylene sulfide resin;
    (b) an inorganic filler; and
    (c) at least one kind of compounds selected from the group consisting of a polymerized indene, a phenol aralkyl resin and a novolak type phenol resin.

2. The polyphenylene sulfide resin composition according to claim 1, wherein said polyphenylene sulfide resin composition contains not more than 500 ppm of ionic impurities.

3. The polyphenylene sulfide resin composition according to claim 1, wherein said (c) component is an indene copolymer comprising an indene monomer, the ratio of said indene monomer to other comonomer should being set to meet a condition of $I/S \geq 1.5$ (where I represents the number of moles of indene monomer, and S denotes the number of moles of other comonomer).

4. The polyphenylene sulfide resin composition according to claim 1, wherein said (c) component is an indene polymer, a mixing ratio of said indene polymer to said polyphenylene sulfide resin being in the range of from 5 percent to 50 percent by weight based on the weight of the polyphenylene sulfide resin, and a mixing ratio of said inorganic filler to the polyphenylene sulfide resin is in the range of from 20 percent to 85 percent by weight based on the weight of the polyphenylene sulfide resin.

5. The polyphenylene sulfide resin composition according to claim 1, wherein said (c) component is phenol aralkyl resin and/or novolak phenol resin, a mixing ratio of said (c) component being set to 30% by weight or less based on an entire weight of the resin composition.

6. The polyphenylene sulfide resin composition according to claim 1, wherein said inorganic filler is spherical silica having an average particle diameter of 30 μm or less.

7. A polyphenylene sulfide resin composition, which comprises a polyphenylene sulfide resin and an inorganic filler; wherein
said polyphenylene sulfide resin includes a polyphenylene sulfide resin component exhibiting a non-Newtonian index (n) of 1.1 or more; and
said inorganic filler includes 5 to 40 wt %, based on a total amount thereof, of fine particles of inorganic filler having an average particle diameter of 1 μm or less.

8. The polyphenylene sulfide resin composition according to claim 7, wherein said polyphenylene sulfide resin composition contains not more than 500 ppm of ionic impurities.

9. The polyphenylene sulfide resin composition according to claim 7, wherein said polyphenylene sulfide resin component exhibiting a non-Newtonian index (n) of 1.1 or more is mixed at a ratio of 30 wt % or more based on an entire polyphenylene sulfide resin matrix.

10. The polyphenylene sulfide resin composition according to claim 7, wherein a mixing ratio of said inorganic filler is in a range of 25 to 80 wt % based on an entire resin composition.

11. A polyphenylene sulfide resin composition, which comprises 20 to 70 wt % of a mixture consisting of a first polyphenylene sulfide resin and a second polyphenylene sulfide resin, and 30 to 80 wt % of an inorganic filler; wherein
said first polyphenylene sulfide resin has a melting viscosity ranging from 1 to 15 Pa·s, and said second polyphenylene sulfide resin has a melting viscosity ranging from 15 to 50 Pa·s and is of substantially non-crosslinking structure; and
a content of said first polyphenylene sulfide resin being 10 to 80 wt % based on said mixture, and a content of said second polyphenylene sulfide resin being 90 to 20 wt % based on said mixture.

12. The polyphenylene sulfide resin composition according to claim 11, wherein said mixture exhibiting a high-temperature crystallization temperature of 220° C. to 240° C.

13. The polyphenylene sulfide resin composition according to claim 11, wherein said polyphenylene sulfide resin composition contains not more than 500 ppm of ionic impurities.

14. The polyphenylene sulfide resin composition according to claim 11, wherein said second polyphenylene sulfide resin is of a linear structure and a high-temperature crystallization temperature of said second polyphenylene sulfide resin is 235° C. or less.

15. The polyphenylene sulfide resin composition according to claim 11, wherein said inorganic filler includes 5 to 40 wt %, based on a total amount thereof, of fine particles of inorganic filler having an average particle diameter of 1 μm or less.

16. A resin-encapsulated semiconductor device comprising a semiconductor element, and a resin layer sealing said semiconductor element, wherein said resin layer is formed of a cured material of the resin composition claimed in claim 1.

17. A resin-encapsulated semiconductor device comprising a semiconductor element, and a resin layer sealing said semiconductor element, wherein said resin layer is formed of a cured material of the resin composition claimed in claim 7.

18. A resin-encapsulated semiconductor device comprising a semiconductor element, and a resin layer sealing said semiconductor element, wherein said resin layer is formed of a cured material of the resin composition claimed in claim 11.

* * * * *